United States Patent
Akiyama

(10) Patent No.: US 7,851,873 B2
(45) Date of Patent: Dec. 14, 2010

(54) SEMICONDUCTOR DEVICE AND METHOD OF MANUFACTURING THE SAME

(75) Inventor: Hajime Akiyama, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 310 days.

(21) Appl. No.: 12/123,720

(22) Filed: May 20, 2008

(65) Prior Publication Data

US 2009/0127637 A1    May 21, 2009

(30) Foreign Application Priority Data

Nov. 16, 2007    (JP)    ............... 2007-298083

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/409; 257/452; 257/484
(58) Field of Classification Search ................ 257/127, 257/170, 339, 374, 409, 452, 484
See application file for complete search history.

(56) References Cited

U.S. PATENT DOCUMENTS 6,118,152 A * 9/2000 Yamaguchi et al. ......... 257/347
6,642,599 B1 * 11/2003 Watabe et al. ............... 257/509

FOREIGN PATENT DOCUMENTS

| JP | 5-315437 | 11/1993 |
| JP | 6-216113 | 8/1994 |
| JP | 8-306893 | 11/1996 |
| JP | 8-335684 | 12/1996 |
| JP | 9-45762 | 2/1997 |
| JP | 9-97832 | 4/1997 |
| JP | 11-312805 | 11/1999 |
| KR | 10-2005-0063315 | 6/2005 |

OTHER PUBLICATIONS

Kazuo Imai, " A New Dielectric Isolation Method Using Porous Silicon", Solid-State Electronics, vol. 24, 1981, pp. 159-161, 163 and 164.

* cited by examiner

*Primary Examiner*—Thien F Tran
(74) *Attorney, Agent, or Firm*—Oblon, Spivak, McClelland, Maier & Neustadt, L.L.P.

(57) ABSTRACT

The HVIC includes a dielectric layer and an SOI active layer stacked on a silicon substrate, a transistor formed in the surface of the SOI active layer, and a trench isolation region formed around the transistor. The dielectric layer includes a first buried oxide film formed in the surface of the silicon substrate, a shield layer formed below the first buried oxide film opposite the element area, a second buried oxide film formed around the shield layer, and a third buried oxide film formed below the shield layer and the second buried oxide film. Therefore, the potential distribution curves PC within the dielectric layer are low in density and a high withstand voltage is achieved.

12 Claims, 17 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, particularly to a semiconductor device with a dielectric layer and a semiconductor layer stacked on a surface of a semiconductor substrate, a semiconductor element formed in the semiconductor layer and a trench isolation region formed around the semiconductor element, and to a method of manufacturing the same.

2. Description of the Background Art

Conventionally, an HVIC (High Voltage IC) is known, which uses a dielectric isolation substrate with a dielectric layer and a semiconductor layer stacked on a surface of a semiconductor substrate, having an IC and a high withstand-voltage device formed monolithically on the surface of the semiconductor layer. The HVIC has advantages such as that devices being mounted can be isolated from each other, products for in-vehicle applications are expected to be developed owing to stable operation under a high temperature, and that a high withstand-voltage device can be fabricated utilizing the RESURF (Reduced Surface) effect.

For example, using the HVIC enables it to make a three-phase level shift circuit into a one-chip formation including even an output device. If a P channel device and an N channel device can be combined as a level shift device, a control circuit can be simplified. Therefore, with regards to the HVIC, it is an important issue to improve the property of the P channel device (particularly a P channel MOS transistor).

A high withstand-voltage P channel MOS transistor may have a source electrode of a predetermined length formed in the surface of a semiconductor layer, a ring-shaped gate electrode formed surrounding the source electrode, a ring-shaped drain electrode formed surrounding the gate electrode, and a ring-shaped trench isolation region formed surrounding the drain electrode.

Another high withstand-voltage P channel MOS transistor may have a drain electrode of a predetermined length formed in the surface of a semiconductor layer, a ring-shaped gate electrode formed surrounding the drain electrode, a ring-shaped source electrode formed surrounding the gate electrode, and a ring-shaped trench isolation region formed surrounding the source electrode (see for example Japanese Patent Laying-Open Nos. 11-312805 and 08-306893).

However, in the P channel MOS transistor with the source electrode arranged in the center section of the ring-shaped drain electrode, the circumference of the source electrode is shorter than the circumference of the drain electrode, resulting in a problem of a smaller amount of injected holes and a low current drivability. Although it is possible to enhance the current drivability by extending the circumference of each electrode, the device area will then be increased to go against the effort to reduce the area by integration.

Moreover, in the P channel MOS transistor with the drain electrode arranged in the center section of the ring-shaped source electrode, the equipotential distribution curves in the trench isolation region and an buried oxide film are high in density when a positive high potential is applied to the source electrode, resulting in a problem of a low withstand voltage.

SUMMARY OF THE INVENTION

Hence it is a primary object of the present invention to provide a high withstand-voltage semiconductor device and a method of manufacturing the same.

A semiconductor device according to the present invention includes a dielectric layer formed in a surface of a semiconductor substrate, a first semiconductor layer formed in a surface of the dielectric layer, a semiconductor element formed in a surface of the first semiconductor layer, and a ring-shaped trench isolation region formed surrounding the semiconductor element. The dielectric layer here includes a first buried oxide film formed in the surface of the semiconductor substrate, a shield layer formed below the first buried oxide film and opposite the semiconductor element and receiving a predetermined potential, a second ring-shaped buried oxide film formed below the first buried oxide film and surrounding the shield layer, and a third buried oxide film formed below the shield layer and the second buried oxide film.

Therefore, a plurality of equipotential distribution curves are branched into curves extending through the first buried oxide film and curves extending through the second and third buried oxide films even when a high potential is applied to the electrode of the semiconductor element, such that the equipotential distribution curves in the dielectric layer are low in density and a high withstand voltage is achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
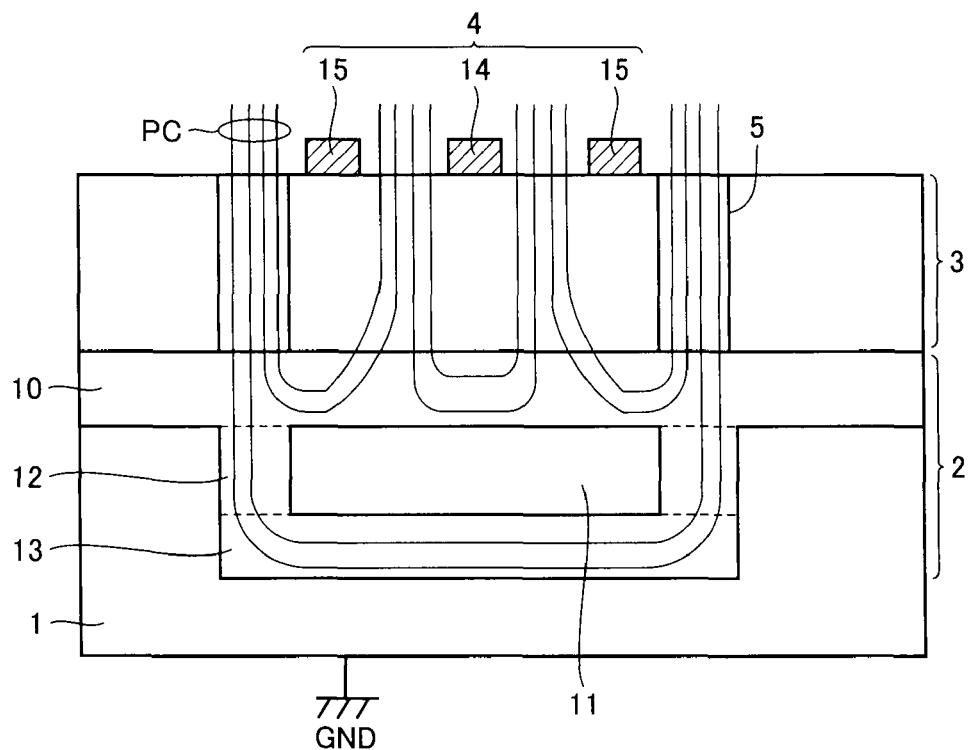
FIG. 1 is a cross sectional view explaining the principle of the present invention.

The principle of the present invention is now explained before the embodiments are described. As shown in FIG. 1, the HVIC according to the present invention has a dielectric layer 2 and an SOI (Silicon on Insulator) active layer 3 stacked on a surface of a silicon substrate 1, a P channel MOS transistor 4 formed in the surface of SOI active layer 3, and a ring-shaped trench isolation region 5 formed surrounding P channel MOS transistor 4.

Dielectric layer 2 includes a first buried oxide film 10 formed in the surface of silicon substrate 1, a shield layer 11 formed below first buried oxide film 10 and opposite the element area, a second buried oxide film 12 formed below first buried oxide film 10 and surrounding shield layer 11, and a third buried oxide film 13 formed below shield layer 11 and second buried oxide film 12. A predetermined potential is applied to shield layer 11. P channel MOS transistor 4 includes a drain electrode 14 formed in the center section of the element area and a ring-shaped source electrode 15 formed surrounding drain electrode 14.

In the HVIC, a plurality of equipotential distribution curves PC passing through trench isolation region 5 are branched into curves extending through first buried oxide film 10 and curves extending through second and third buried oxide films 12 and 13, even when a positive high potential HV is applied to source electrode 15 and a ground potential GND is applied to drain electrode 14, such that the potential distribution curves PC within dielectric layer 2 are low in density and a high withstand voltage is achieved.

Moreover, even when the potential of silicon substrate 1 fluctuates, the potential fluctuation is prevented from being transmitted to P channel MOS transistor 4 because shield layer 11 is fixed to a predetermined potential, resulting in preventing a malfunction of P channel MOS transistor 4.

Moreover, the film thickness of dielectric layer 2 directly below P channel MOS transistor 4 of high withstand voltage and the film thickness of dielectric layer 2 directly below the IC of low withstand voltage can be set up individually such that it is possible to reduce the warping of the silicon wafer generated in the manufacturing process or to efficiently allow the heat generated in operation at the IC to escape towards silicon substrate 1.

Figure 2:
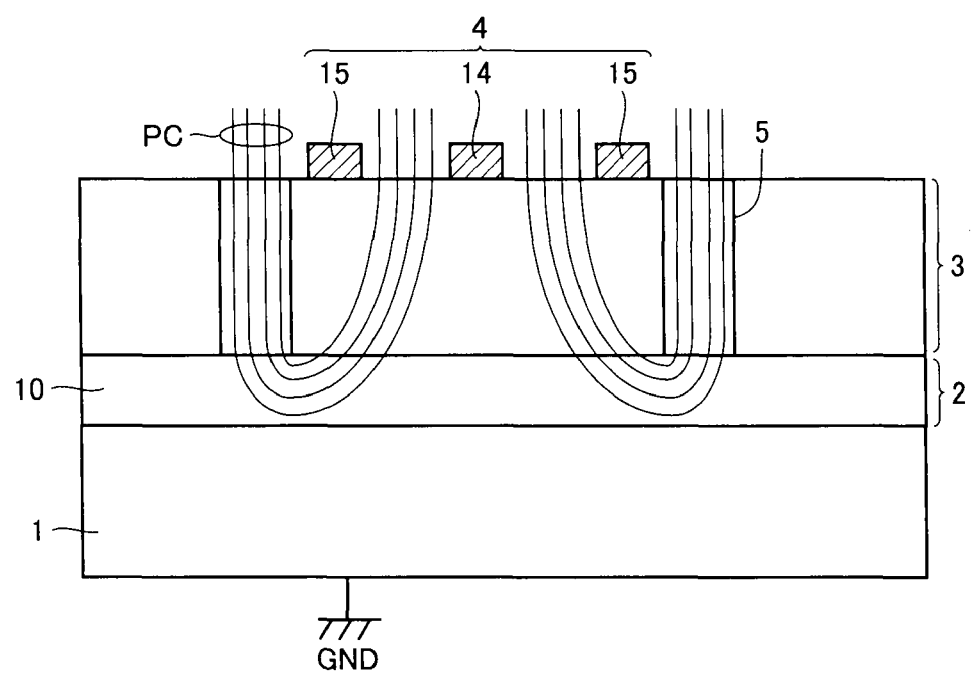
FIG. 2 is a cross sectional view explaining the effect of the present invention.

Note that, in a case where there is no second and third buried oxide films 12 and 13 and shield layer 11, as shown in FIG. 2, the equipotential distribution curves PC within first buried oxide film 10 are high in density such that the withstand voltage is low. In addition, if the potential of silicon substrate 1 fluctuates, the potential fluctuation will be transmitted to P channel MOS transistor 4 to cause a malfunction of P channel MOS transistor 4. Moreover, the film thickness of dielectric layer 2 is made with uniform thickness in the entire HVIC region such that the warping of the silicon wafer is generated in the manufacturing process or it is impossible to efficiently allow the heat generated in operation at the IC to escape towards silicon substrate 1, easily causing the malfunction due to the temperature rise of the HVIC. Hereafter, the HIVC according to the present invention is described in detail with reference to the figures.

First Embodiment

Figure 3A:
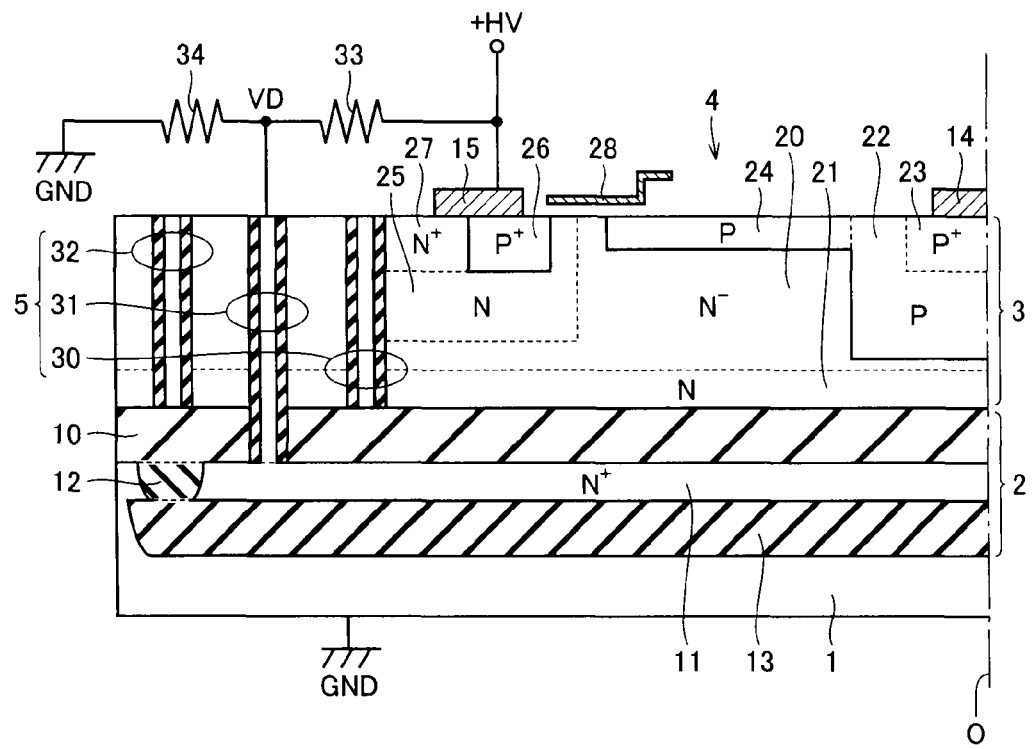
FIGS. 3A and 3B are cross sectional views showing the principal part of the HVIC according to a first embodiment of the present invention.

FIG. 3A is a cross sectional view showing the principal part of the HVIC according to the first embodiment of the present invention. The HVIC in FIG. 3A includes silicon substrate 1, dielectric layer 2 formed in the surface of silicon substrate 1, SOI active layer 3 formed in the surface of dielectric layer 2, P channel MOS transistor 4 formed in the surface of SOI active layer 3, and ring-shaped trench isolation region 5 formed surrounding P channel MOS transistor 4. SOI active layer 3 is formed of an N type single crystal silicon layer 20. Note that the dashed-dotted line O in the figure is a central line of the device.

Dielectric layer 2, as shown in FIG. 1, includes first to third buried oxide films 10, 12 and 13 and shield layer 11. First buried oxide film 10 is formed of a thermal oxide film, each of second and third buried oxide films 12 and 13 is formed of a porous oxide film, and shield layer 11 is formed of an N⁺ type single crystal silicon layer.

Within SOI active layer 3A, an N type well 21 of low impurity concentration is formed in the area adjoining dielectric layer 2. Moreover, a P type well 22 is formed in the surface of the center section of the area surrounded by trench isolation region 5 within SOI active layer 3. A P⁺ type drain contact layer 23 is formed in the center section of the surface of P type well 22, and a ring-shaped P type drain layer 24 is formed in the outer area of P type well 22. Drain electrode 14 is formed in the surface of P⁺ type drain contact layer 23.

In addition, a ring-shaped N type well 25 is formed in the surface of SOI active layer 3 along the inner side of trench isolation region 5. A ring-shaped P⁺ type source diffusion layer 26 is formed in the surface of N type well 25 in the area closer to P type drain layer 24, and a ring-shaped N⁺ type source diffusion layer 27 for applying a bias potential to N type well 25 is formed in the surface of N type well 25 in the outer area of P⁺ type source diffusion layer 26. Source electrode 15 is formed in the surfaces of P⁺ type source diffusion layer 26 and N⁺ type source diffusion layer 27.

Since each of P type drain layer 24 and P⁺ type source diffusion layer 26 is formed in a shape of a ring, the channel area between them is also formed in a shape of the ring. A ring-shaped gate electrode 28 is formed above the ring-shaped channel area, having a gate oxide film (not shown) therebetween.

Thus, P channel MOS transistor 4 is formed in the area surrounded by trench isolation region 5 within SOI active layer 3. P type well 22, N type well 21 of low impurity concentration and N type well 25 form a PIN structure in this P channel MOS transistor 4. Therefore, if a high voltage is applied between source electrode 15 and drain electrode 14, the high voltage is shared by a depletion layer generated within N type well 21 and dielectric layer 2, and a high withstand voltage is achieved.

Figure 4:
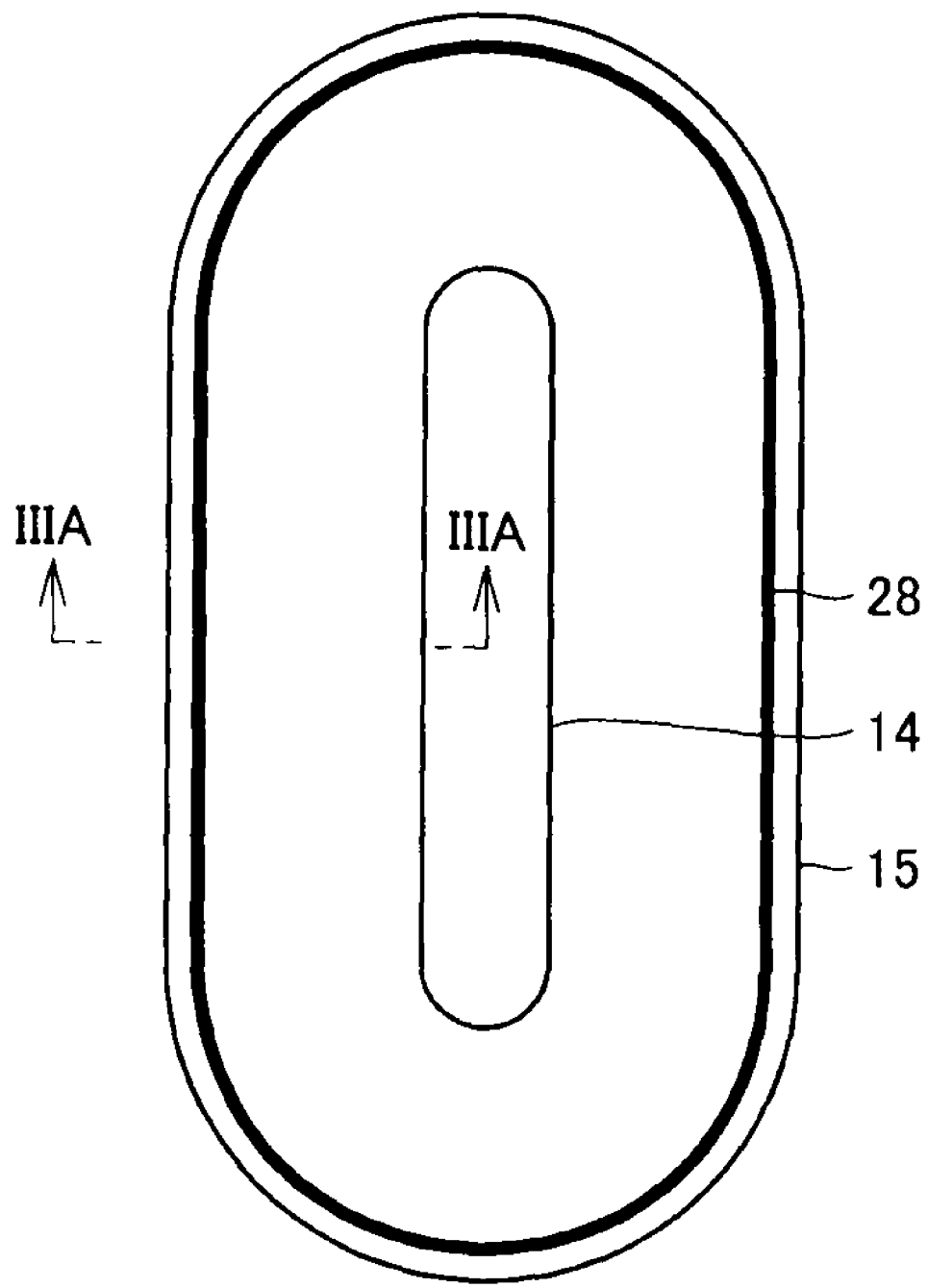
FIG. 4 shows the layout of the electrode of the P channel MOS transistor shown in FIGS. 3A and 3B.

FIG. 4 shows a layout of drain electrode 14, source electrode 15 and gate electrode 28 of P channel MOS transistor 4. In FIG. 4, oval drain electrode 14 is formed in the center section of the element area, ring-shaped gate electrode 28 is formed surrounding drain electrode 14, and ring-shaped source electrode 15 is formed surrounding gate electrode 28.

The distance between the outer periphery of drain electrode 14 and the inner periphery of gate electrode 28 is kept constant, and the distance between the outer periphery of gate electrode 28 and the inner periphery of source electrode 15 is also kept constant. Therefore, the channel region between the source and drain of P channel MOS transistor 4 is ring-shaped with a fixed width, such that the concentration of electric field is mitigated and a high withstand voltage is achieved. Note that FIG. 3A is a IIIA-IIIA line cross sectional view of FIG. 4.

Returning back to FIG. 3A, trench isolation region 5 includes a ring-shaped first trench 30 formed surrounding the region in which P channel MOS transistor 4 is formed, a second trench 31 formed surrounding first trench 30, and a third trench 32 formed surrounding second trench 31.

First and second trenches 30 and 31 are provided above shield layer 11, and third trench 32 is provided above second buried oxide film 12. Each of first and third trenches 30 and 32 penetrates SOI active layer 3 and reaches first buried oxide film 10, and second trench 31 penetrates SOI active layer 3 and first buried oxide film 10 and reaches shield layer 11.

An oxide film is formed in each sidewall of each of inner and outer sides of first to third trenches 30-32, and a conductive polysilicon layer is formed between the oxide films on both sides. The conductive polysilicon layer within second trench 31 connects electrically to shield layer 11. A ring-shaped bottom of third trench 32 is formed opposite ring-shaped second buried oxide film 12.

Moreover, the HVIC includes resistance elements 33 and 34 connected in series between source electrode 15 and a line of the ground potential GND. Supposing that +HV is a positive high voltage applied to source electrode 15 and R1 and R2 are the resistance value of resistance elements 33 and 34, respectively, a voltage VD of a node between resistance elements 33 and 34 is represented as VD=+HV×R2/(R1+R2). This voltage VD is applied to shield layer 11 through the conductive polysilicon layer within second trench 31.

Figure 3B:
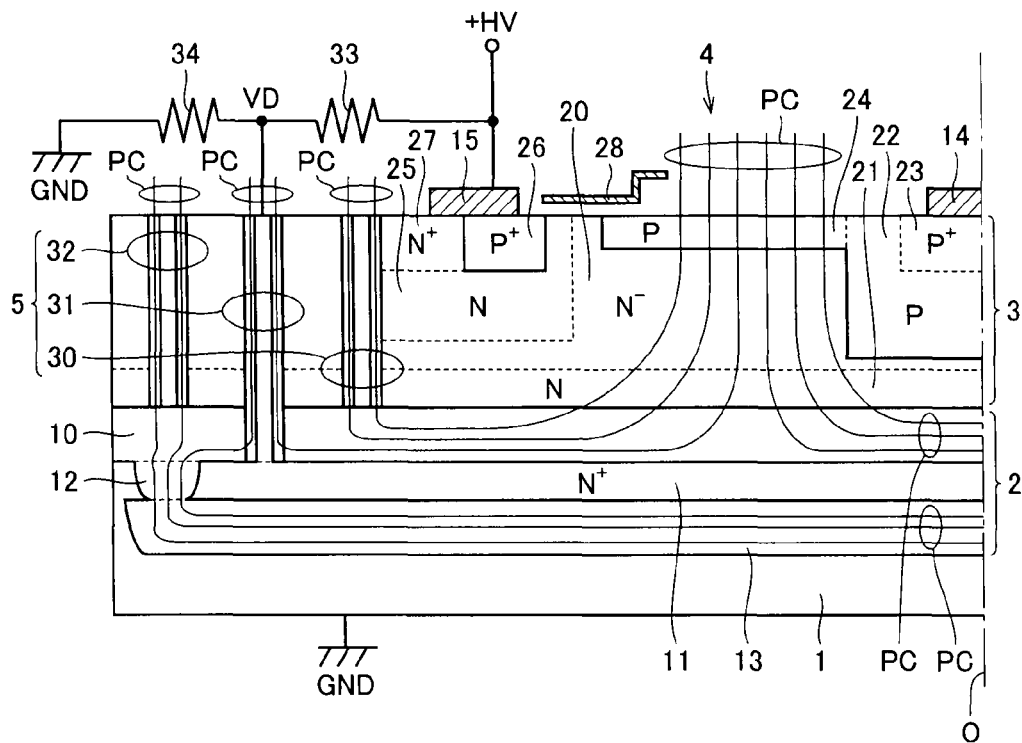

FIG. 3B shows an equipotential distribution when a positive high voltage (+HV) is applied to source electrode 15 of P channel MOS transistor 4 and a ground potential GND is applied to drain electrode 14. In FIG. 3B, a plurality of equipotential distribution curves PC passing through inside first to third trenches 30-32 are branched into curves extending through first buried oxide film 10, and curves extending through second and third buried oxide films 12 and 13. The branching ratio of equipotential distribution curves PC changes according to voltage division ratio R2/(R1+R2) of resistance elements 33 and 34. Therefore, by setting voltage division ratio R2/(R1+R2) of resistance elements 33 and 34 to an optimum value to minimize the density of equipotential distribution curves PC in dielectric layer 2, a high withstand voltage is achieved.

Figure 5A:
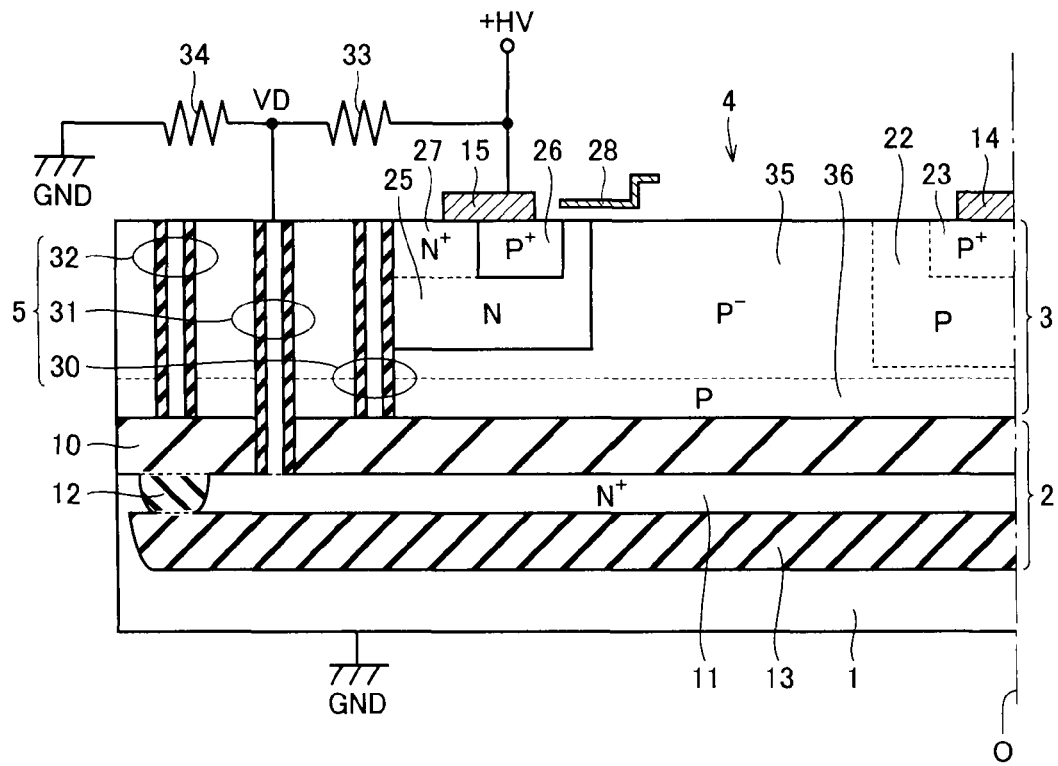
FIGS. 5A and 5B are cross sectional views showing a modification of the first embodiment.
Figure 5B:
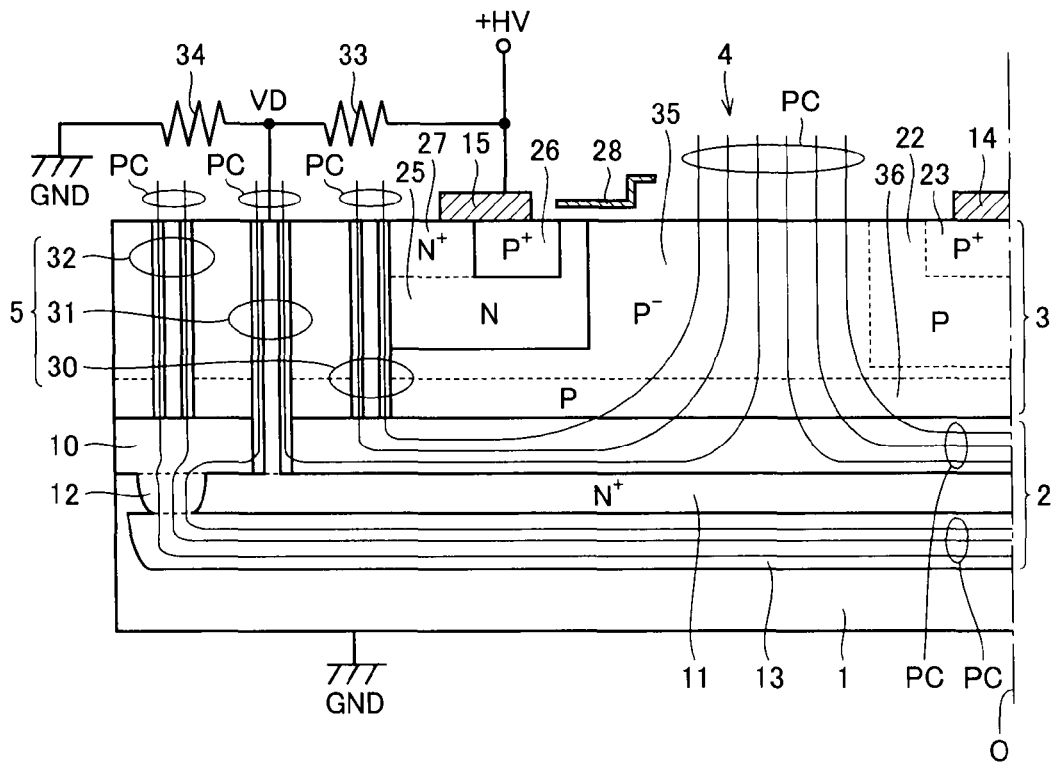

FIGS. 5A and 5B are cross sectional views showing a modification of the first embodiment, and are compared with FIGS. 3A and 3B. In FIGS. 5A and 5B, this modification is different from the HVIC of the first embodiment in that SOI active layer 3 is formed of P⁻ type single crystal silicon layer 35, N type well 21 of low impurity concentration is replaced by P type well 36 of low impurity concentration, and that P type drain layer 24 is not provided. In this modification as well, the same effect as the first embodiment can be obtained.

Second Embodiment

Figure 6A:
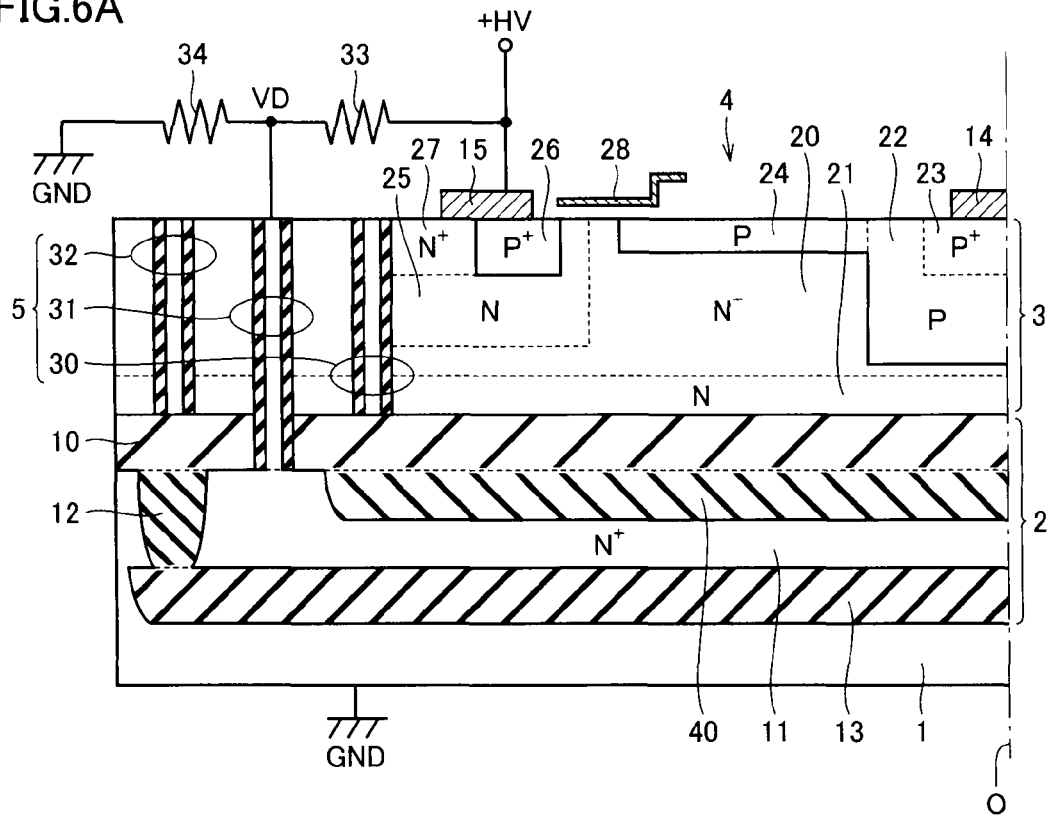
FIGS. 6A and 6B are cross sectional views showing the principal part of the HVIC according to a second embodiment of the present invention.

FIG. 6A is a cross sectional view showing a principal part of the HVIC according to the second embodiment of the present invention, and is compared with FIG. 3A. In FIG. 6A, this HVIC is different from the HVIC of the first embodiment in that a fourth buried oxide film 40 is added. Fourth buried oxide film 40 is provided below first buried oxide film 10 in the region inner than second trench 31 in a condition of being embedded in the surface of shield layer 11. First and fourth buried oxide films 10 and 40 are integrally formed of a porous oxide film.

Figure 6B:
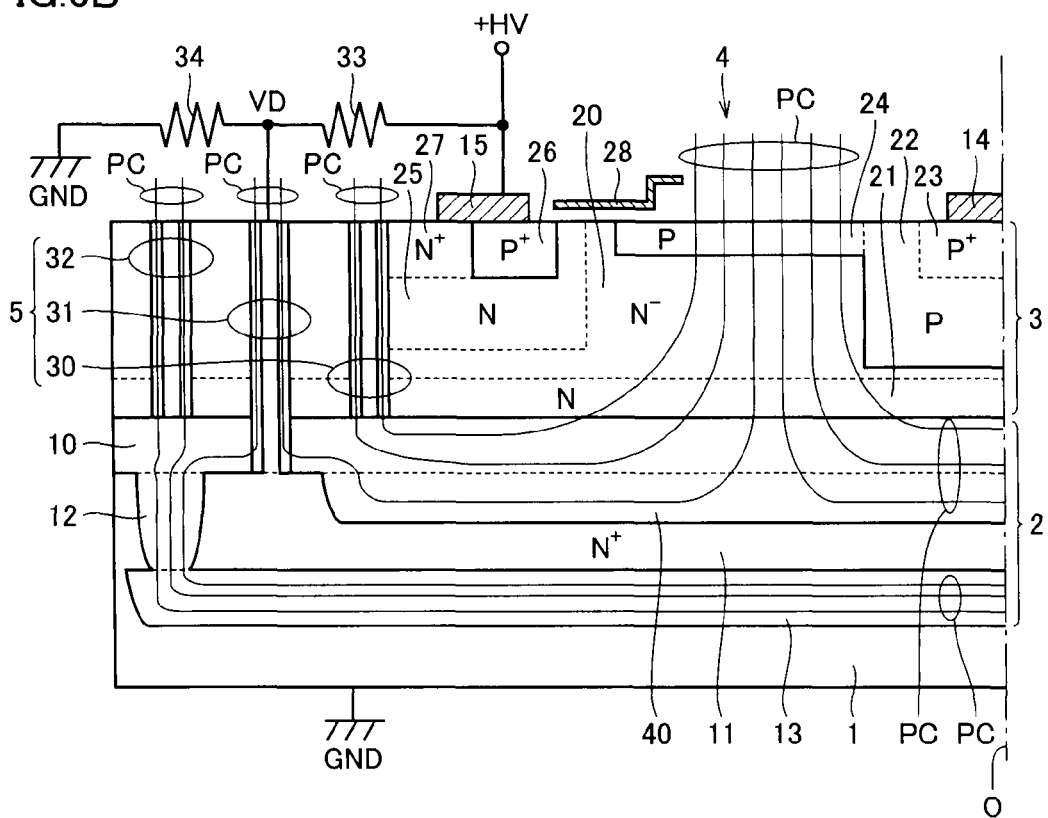

FIG. 6B shows an equipotential distribution when a positive high voltage (+HV) is applied to source electrode 15 of P channel MOS transistor 4 and a ground potential GND is applied to drain electrode 14. As shown in FIG. 6B, a plurality of equipotential distribution curves PC passing through inside first to third trenches 30-32 are branched into curves extending through first and fourth buried oxide films 10, 40 and curves extending through second and third buried oxide films 12 and 13. Therefore, the equipotential distribution curves PC can be lower in density than in the first embodiment by the amount corresponding to fourth buried oxide film 40, and a high withstand voltage is achieved.

Figure 7A:
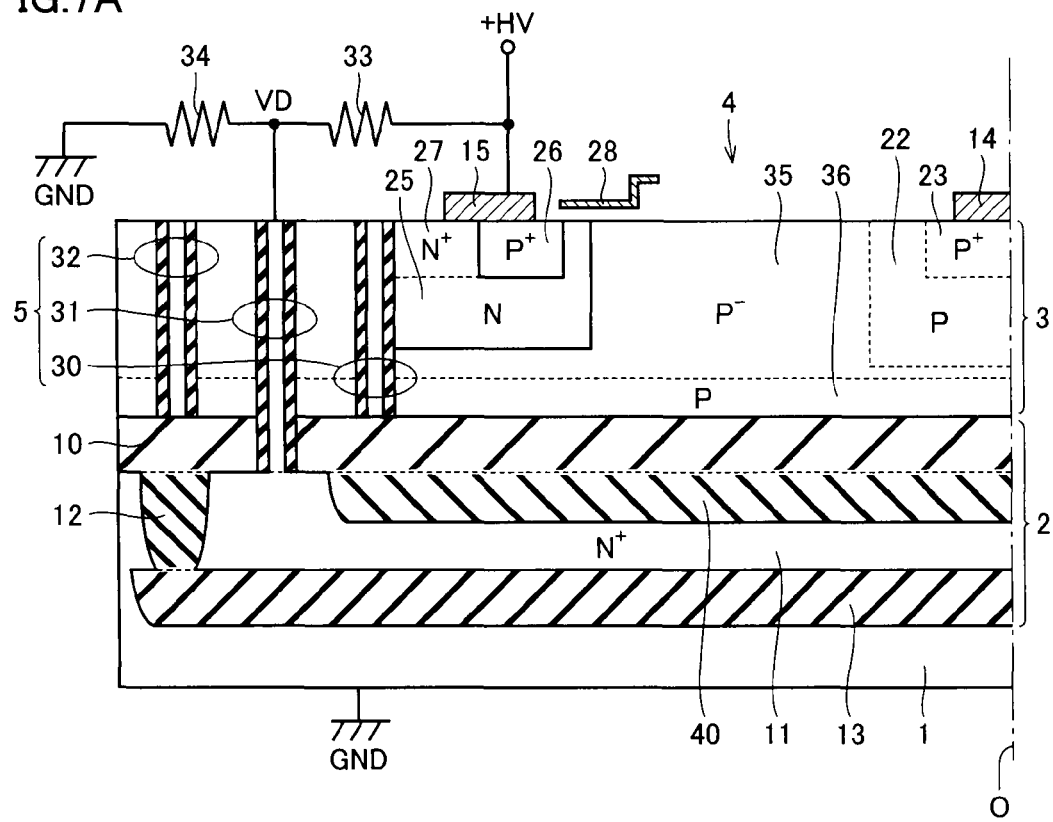
FIGS. 7A and 7B are cross sectional views showing a modification of the second embodiment.
Figure 7B:
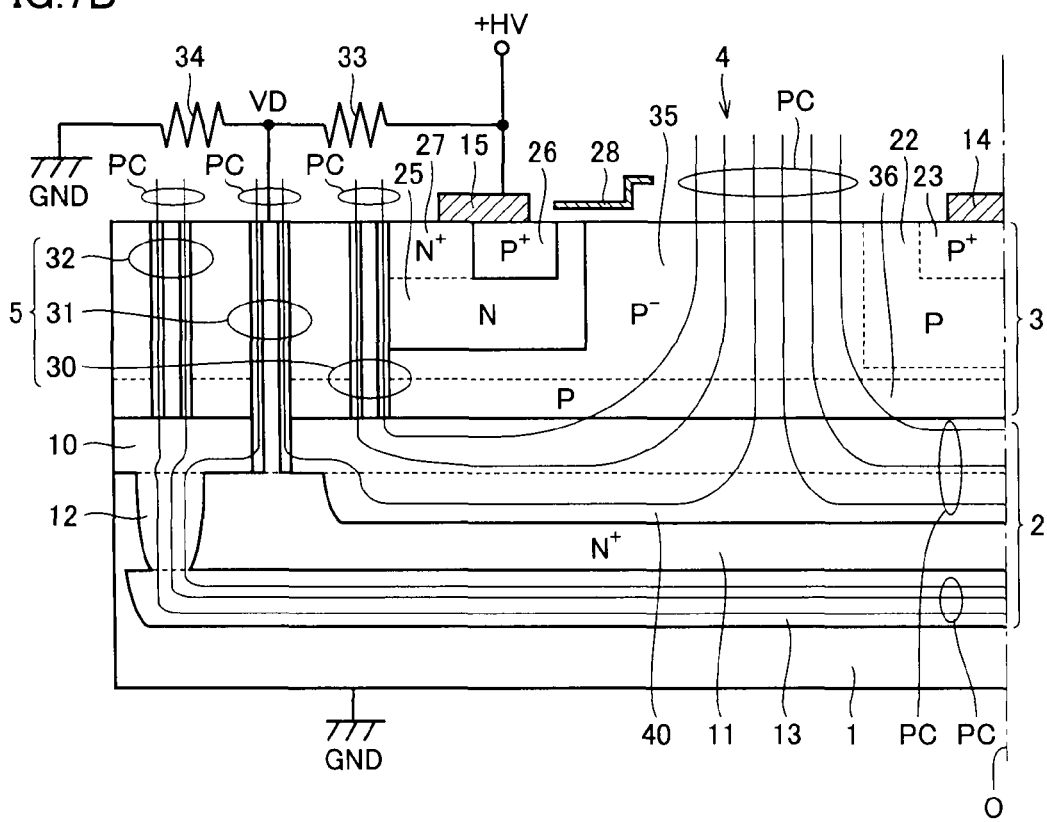

FIGS. 7A and 7B are cross sectional views showing a modification of the second embodiment, and are compared with FIGS. 6A and 6B. In FIGS. 7A and 7B, this modification is different from the HVIC of the second embodiment in that SOI active layer 3 is formed of P⁻ type single crystal silicon layer 35, N type well 21 of low impurity concentration is replaced by P type well 36 of low impurity concentration, and that P type drain layer 24 is not provided. In this modification as well, the same effect as the second embodiment can be obtained.

Third Embodiment

Figure 8A:
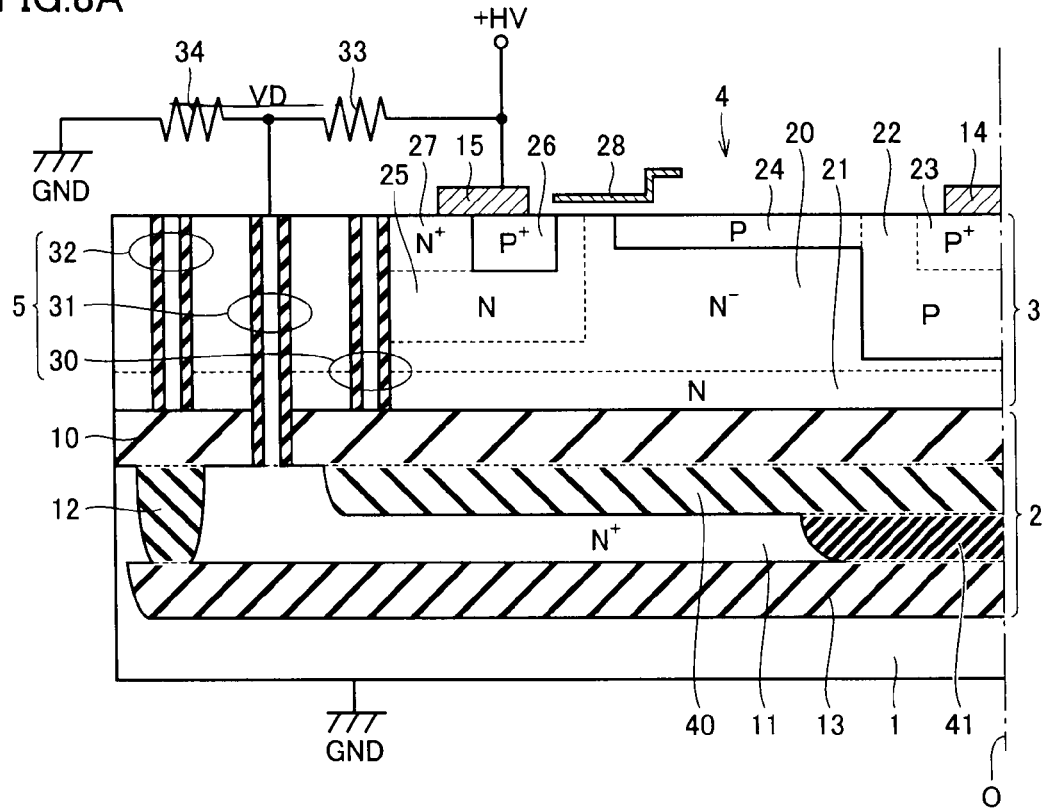
FIGS. 8A and 8B are cross sectional views showing the principal part of the HVIC according to a third embodiment of the present invention.

FIG. 8A is a cross sectional view showing a principal part of the HVIC according to the third embodiment of the present invention, and is compared with FIG. 6A. In FIG. 8A, this HVIC is different from the HVIC of the second embodiment in that a fifth buried oxide film 41 is added. Fifth buried oxide film 41 is provided between third buried oxide film 13 and fourth buried oxide film 40 in the region lower than the drain region in a condition of replacing a central portion of shield layer 11. In the region lower than the drain region, first buried oxide film 10 and third to fifth buried oxide films 13, 40 and 41 are integrally formed of a porous oxide film.

Figure 8B:
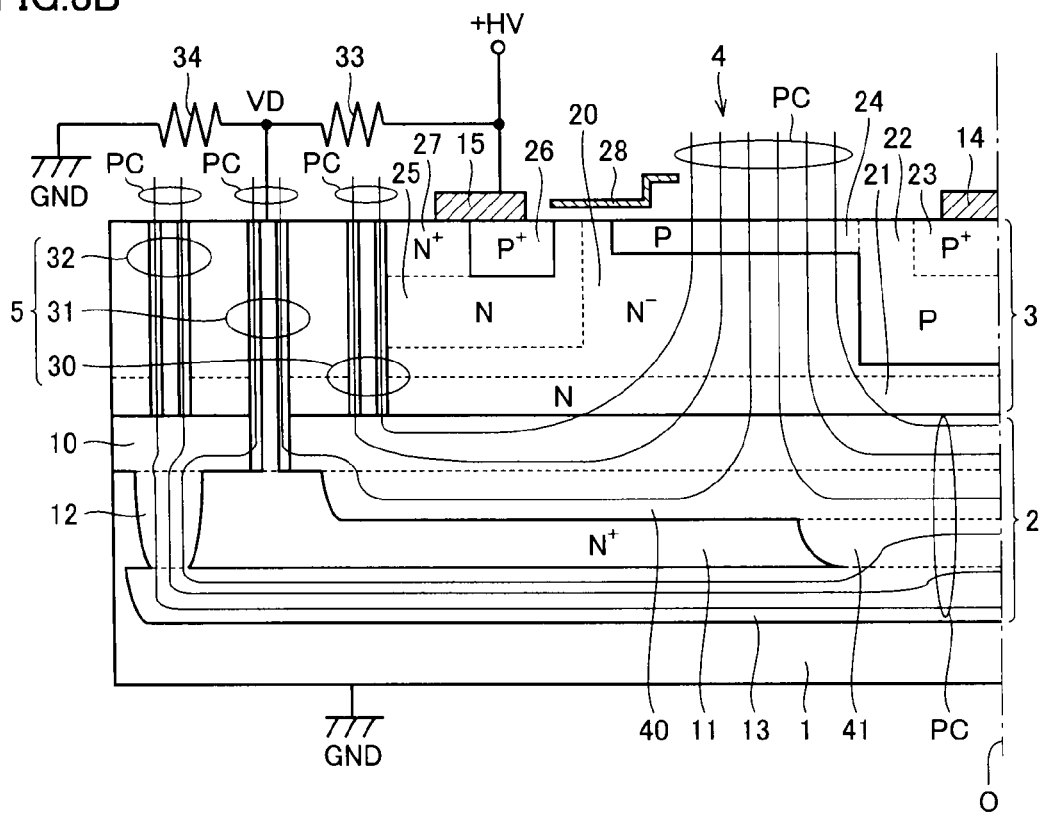

FIG. 8B shows an equipotential distribution when a positive high voltage (+HV) is applied to source electrode 15 of P channel MOS transistor 4 and a ground potential GND is applied to drain electrode 14. As shown in FIG. 8B, a plurality of equipotential distribution curves PC passing through inside first to third trenches 30-32 are branched into curves extending through first and fourth buried oxide films 10, 40 and curves extending through second and third buried oxide films 12 and 13. In addition, the plurality of equipotential distribution curves PC which were branched into curves extending through the upper side and curves extending through the lower side of shield layer 11 are unified below the drain region. Therefore, the equipotential distribution curves PC can be lower in density than in the second embodiment by the amount corresponding to fifth buried oxide film 41, and a high withstand voltage is achieved.

Figure 9A:
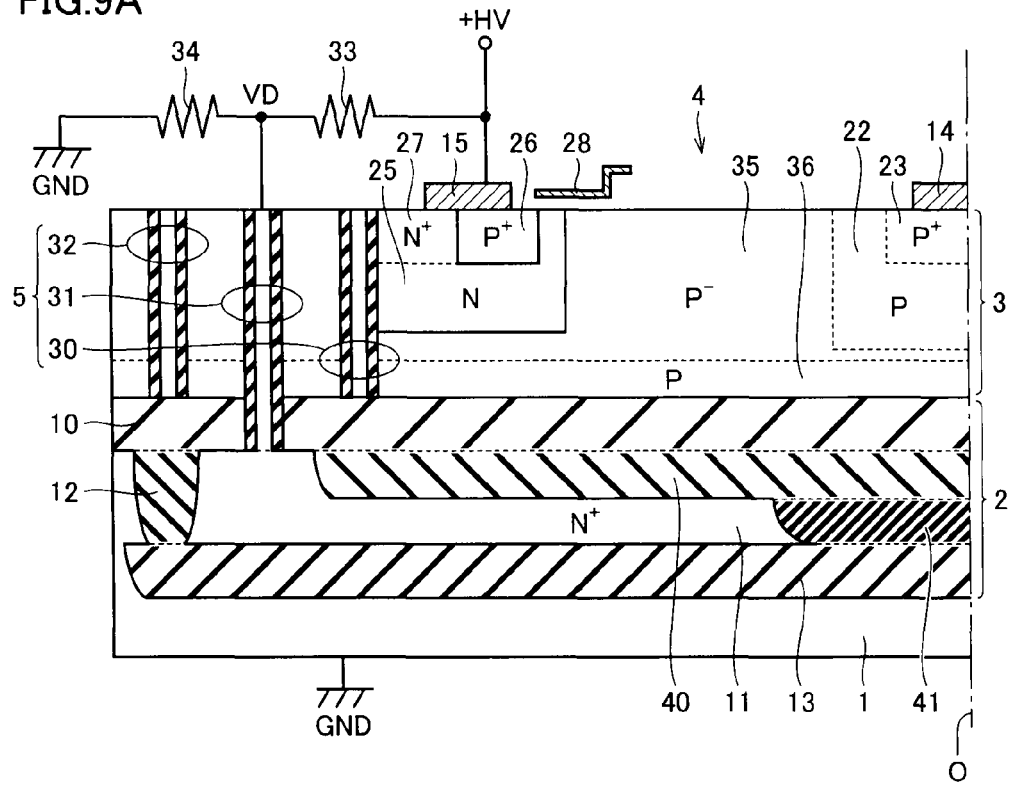
FIGS. 9A and 9B are cross sectional views showing a modification of the third embodiment.
Figure 9B:
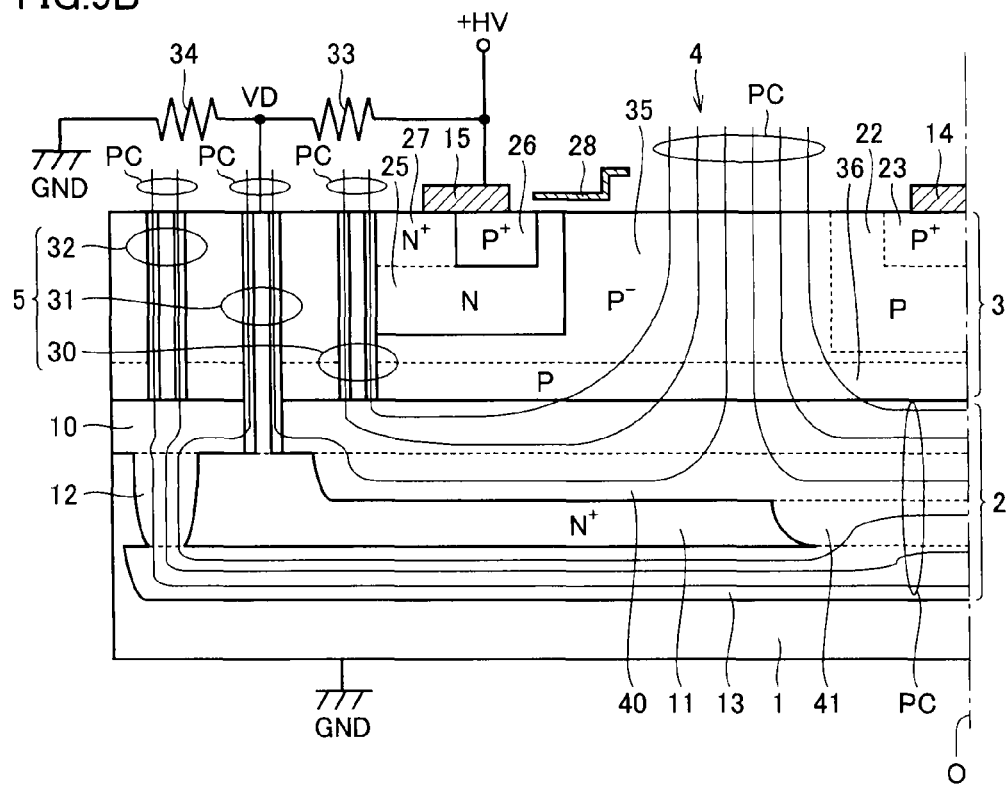

FIGS. 9A and 9B are cross sectional views showing a modification of the third embodiment, and are compared with FIGS. 8A and 8B. In FIGS. 9A and 9B, this modification is different from the HVIC of the third embodiment in that SOI active layer 3 is formed of P⁻ type single crystal silicon layer 35, N type well 21 of low impurity concentration is replaced by P type well 36 of low impurity concentration, and that P type drain layer 24 is not provided. In this modification as well, the same effect as the third embodiment can be obtained.

Fourth Embodiment

Figure 10A:
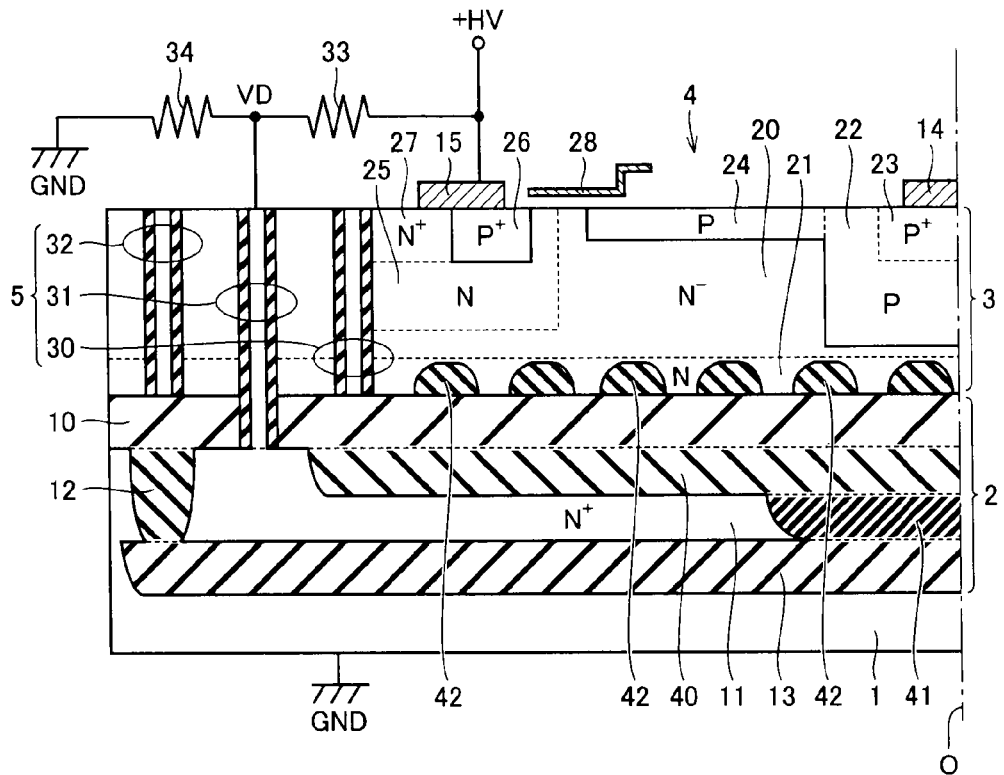
FIGS. 10A and 10B are cross sectional views showing the principal part of the HVIC according to a fourth embodiment of the present invention.

FIG. 10A is a cross sectional view showing a principal part of the HVIC according to the fourth embodiment of the present invention, and is compared with FIG. 8A. In FIG. 10A, this HVIC is different from the HVIC of the third embodiment in that one or a plurality of (6 in the figure) sixth buried oxide films 42 are added. Sixth buried oxide film 42 is provided above first buried oxide film 10 in the region inner than first trench 30 in a condition of being formed in a shape of a ring, projecting into N type well 21 of low impurity concentration.

Figure 10B:
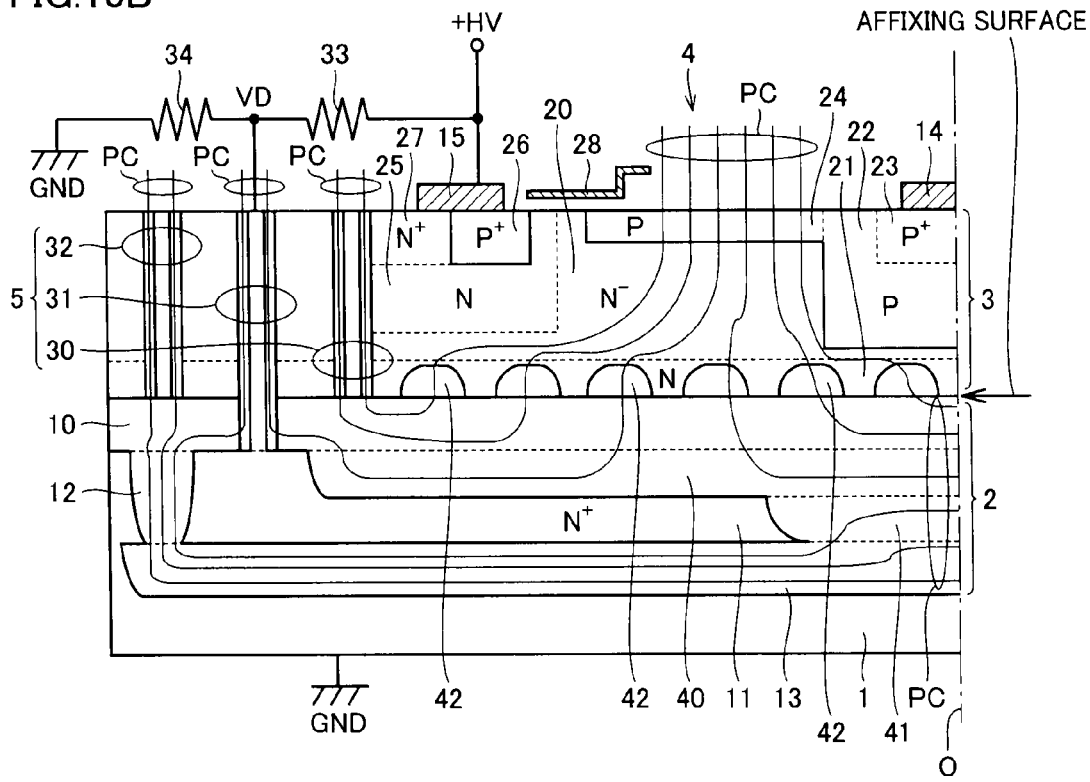

FIG. 10B shows an equipotential distribution when a positive high voltage (+HV) is applied to source electrode 15 of P channel MOS transistor 4 and a ground potential GND is applied to drain electrode 14. As shown in FIG. 10B, a plurality of equipotential distribution curves PC passing through inside first to third trenches 30-32 are branched into curves extending through first and fourth buried oxide films 10, 40 and curves extending through second and third buried oxide films 12 and 13. Moreover, a plurality of equipotential distribution curves PC which were branched into curves extending through the upper side and curves extending through the lower side of shield layer 11 are unified below the drain region. Furthermore, the plurality of equipotential distribution curves PC is distributed evenly in a lateral direction in N type well 21. Therefore, the equipotential distribution curves PC can be lower in density than in the third embodiment by the amount corresponding to sixth buried oxide film 42, and a high withstand voltage is achieved.

Figure 11:
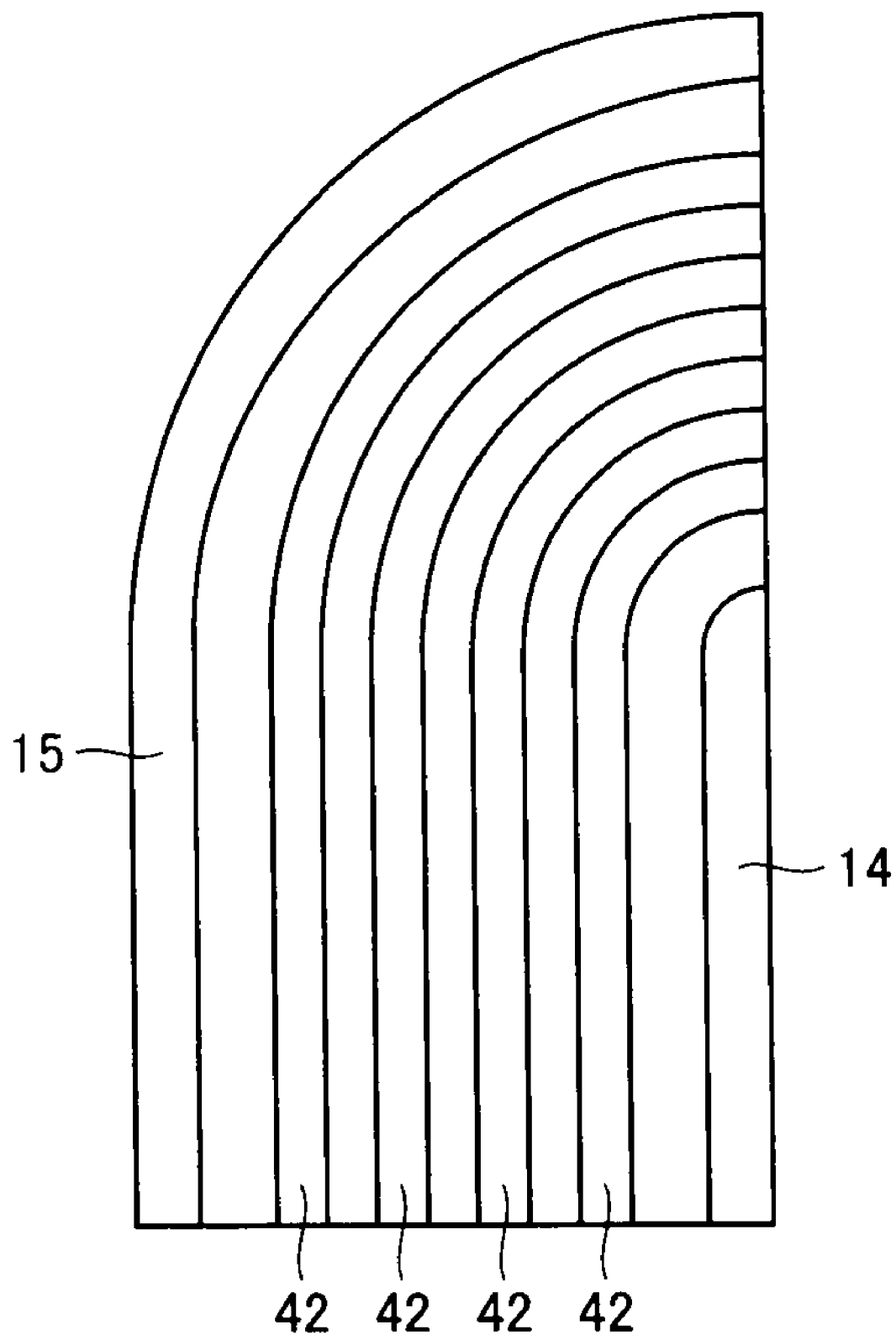
FIG. 11 shows the layout of the sixth buried oxide film shown in FIGS. 10A and 10B.

FIG. 11 shows a diagram of a layout of a plurality of sixth buried oxide films 42. In FIG. 11, the plurality of sixth buried oxide films 42 is laid out in a shape of a track with a plurality of courses. That is, drain electrode 14 is arranged in the center of the track, and source electrode 15 is arranged on the outermost course. The plurality of sixth buried oxide films 42 is arranged on the plurality of courses, respectively. Each sixth buried oxide film 42 is formed in a shape of an ellipse ring, and the circumference of an outer sixth buried oxide film 42 is longer than the circumference of an inner sixth buried oxide film 42.

Figure 12A:
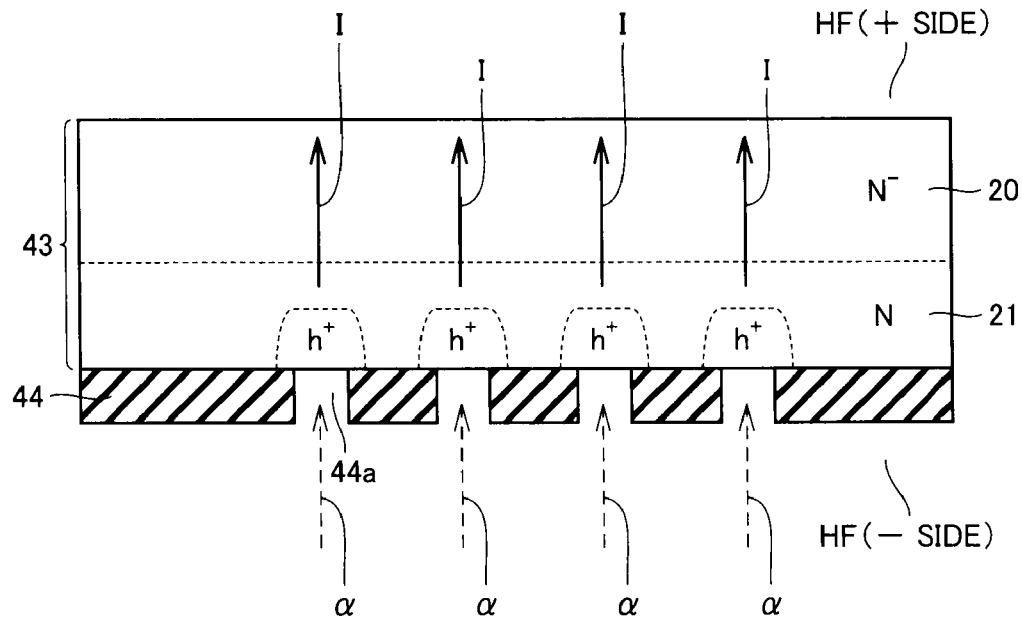
FIGS. 12A to 12C show a method of manufacturing the sixth buried oxide film shown in FIGS. 10A and 10B.
Figure 12B:
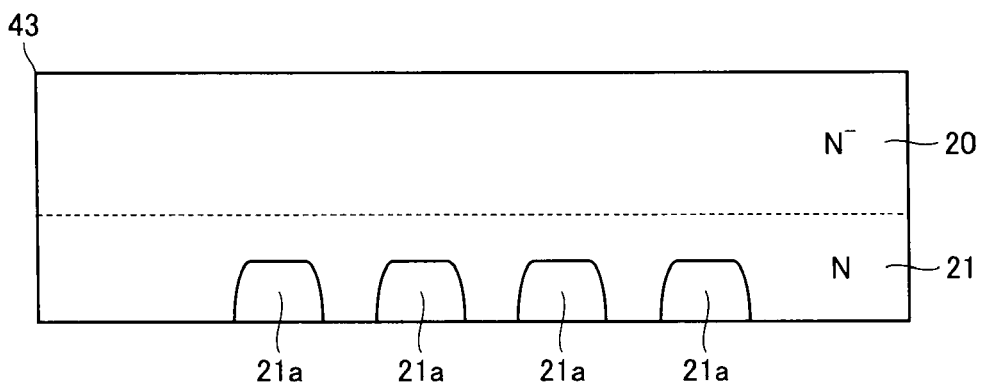
Figure 12C:
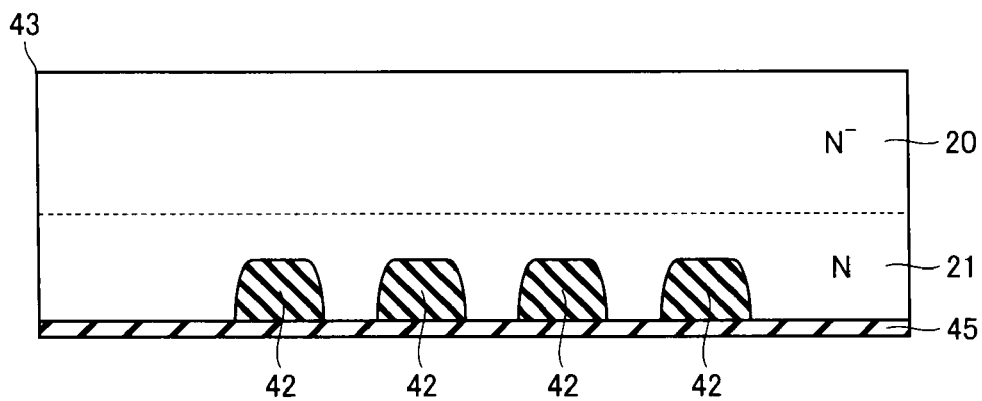

FIGS. 12A-12C show a method of manufacturing sixth buried oxide film 42. In this HVIC, two silicon substrates 1 and 43 are used. Dielectric layer 2 is formed in the surface of silicon substrate 1. The other silicon substrate 43 is formed of N⁻ type single crystal silicon layer 20, as shown in FIG. 12A. After forming N type well 21 of low impurity concentration in the bottom of silicon substrate 43, a mask 44 formed of a light shielding film is formed in the surface of N type well 21. A plurality of pores 44a, shaped corresponding to the shape in plan view of the plurality of sixth buried oxide films 42, is formed in mask 44.

Next, the front side and the rear side of silicon substrate 43 are immersed independently in an HF solution. If a positive (+) potential is applied to the N⁻ type single crystal silicon layer 20 side and a negative (−) potential is applied to the N type well 21 side in this state, anodization current I will flow within silicon substrate 43. Subsequently, when a light α for excitation is radiated to N type well 21 through pores 44a from the mask 44 side, holes h⁺ are generated in a portion of N type well 21 which has received the light and a chemical reaction represented by formula (1) below occurs in the portion:

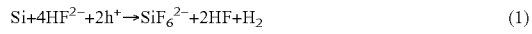

$$Si+4HF^{2-}+2h^+ \rightarrow SiF_6^{2-}+2HF+H_2 \quad (1)$$

By this chemical reaction, as shown in FIG. 12B, a porous silicon film 21a is generated in a portion corresponding to pore 44a of mask 44 of N type well 21. Note that the cross sectional shape of porous silicon film 21a is swelled in the width direction because the anodization reaction is isotropic. When the surface of N type well 21 is treated with thermal oxidation after mask 44 is removed, porous silicon film 21a is oxidized and changed to sixth buried oxide film 42 (porous oxide film), as shown in FIG. 12C, and an oxide film 45 is formed in the entire surface of N type well 21. This oxide film 45 is affixed to first buried oxide film 10 formed in the surface of substrate 1. The film thickness of oxide film 45 can be set to be very thin because the thermal oxidation rate of porous silicon film 21a is tens to hundreds of times higher than the thermal oxidation rate of a single crystal silicon.

Figure 13:
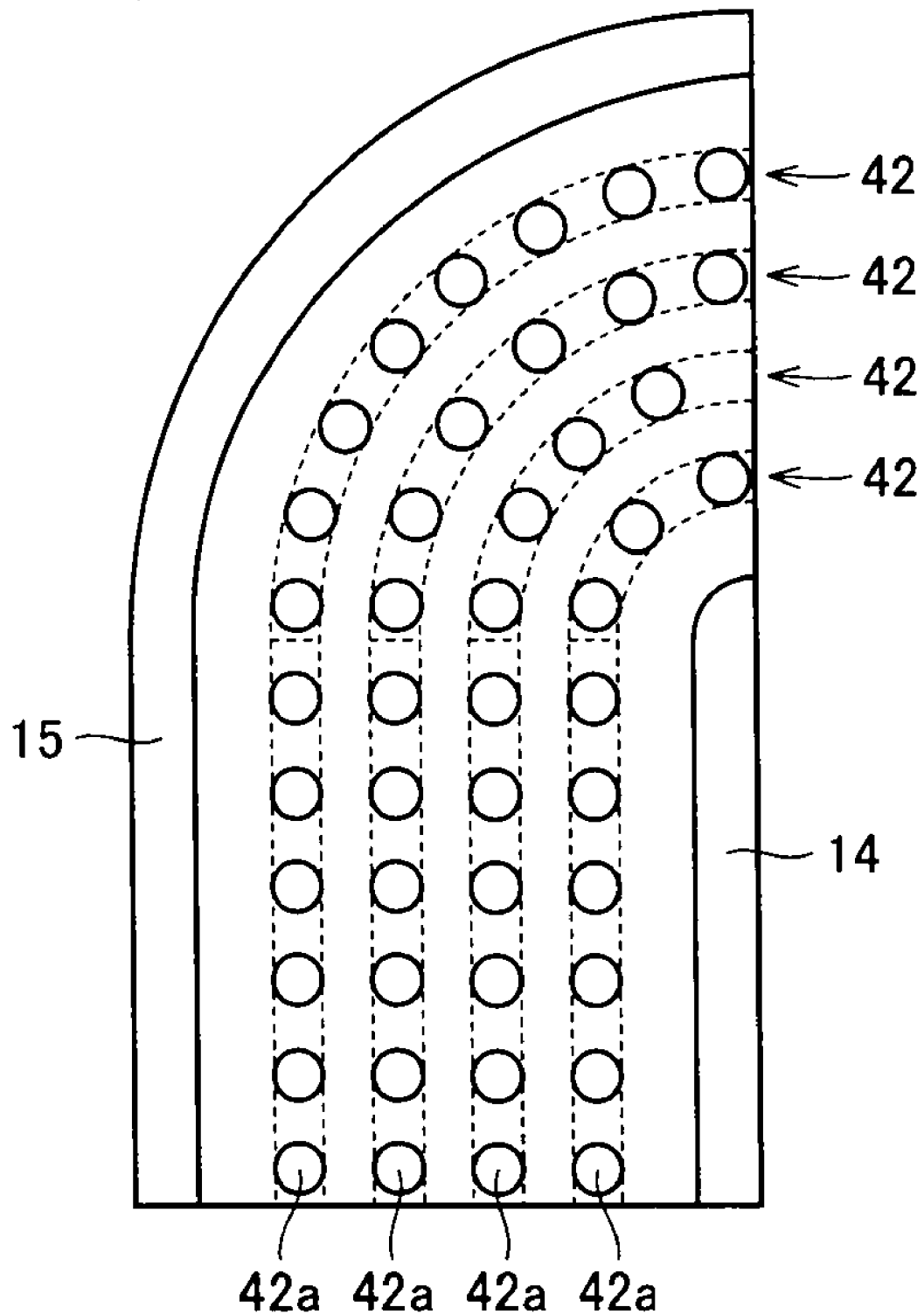
FIG. 13 is a cross sectional view showing a modification of the fourth embodiment.

FIG. 13 is a cross sectional view showing another modification of the fourth embodiment, and is compared with FIG. 11. In FIG. 13, this modification is different from the HVIC of the third embodiment in that each sixth buried oxide film 42 is divided into a plurality of oxide films 42a arranged in a shape of a ring with a predetermined pitch. Each oxide-film 42a is formed in a shape of a dot. In this modification as well, the same effect as the third embodiment can be obtained.

Figure 14A:
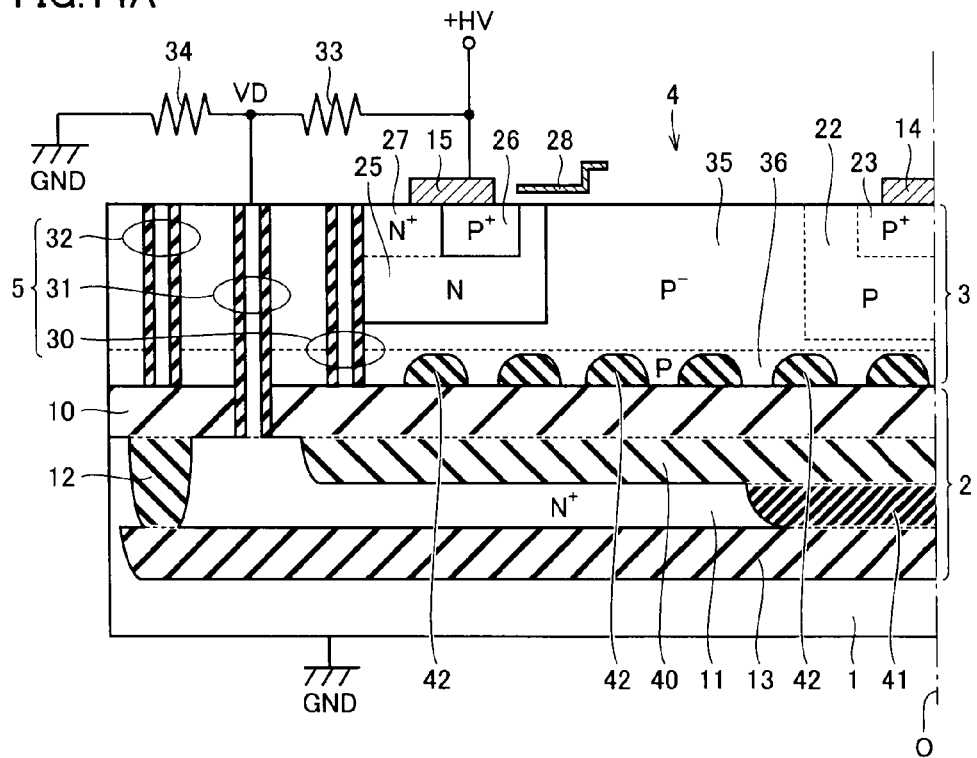
FIGS. 14A and 14B are cross sectional views showing another modification of the fourth embodiment.
Figure 14B:
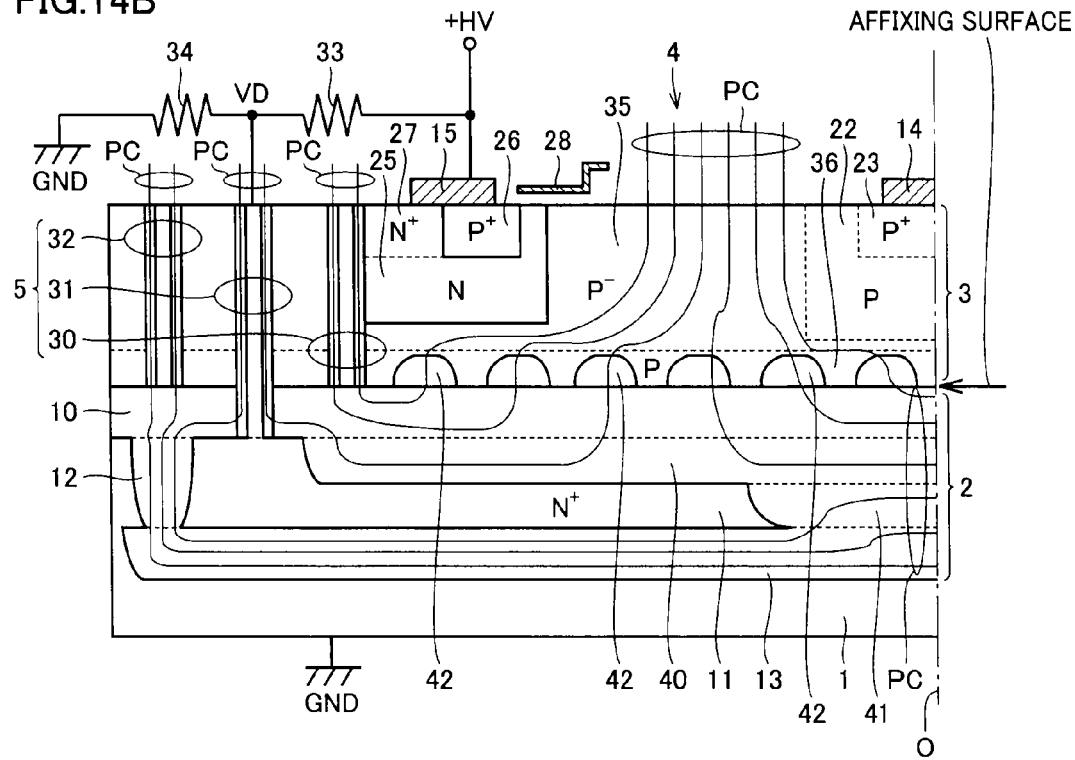

FIGS. 14A and 14B are cross sectional views showing another modification of the fourth embodiment, and are compared with FIGS. 10A and 10B. In FIGS. 14A and 14B, this modification is different from the HVIC of the third embodiment in that SOI active layer 3 is formed of P⁻ type single crystal silicon layer 35, N type well 21 of low impurity concentration is replaced by P type well 36 of low impurity concentration, and that P type drain layer 24 is not provided. In this modification as well, the same effect as the third embodiment can be obtained.

Figure 15A:
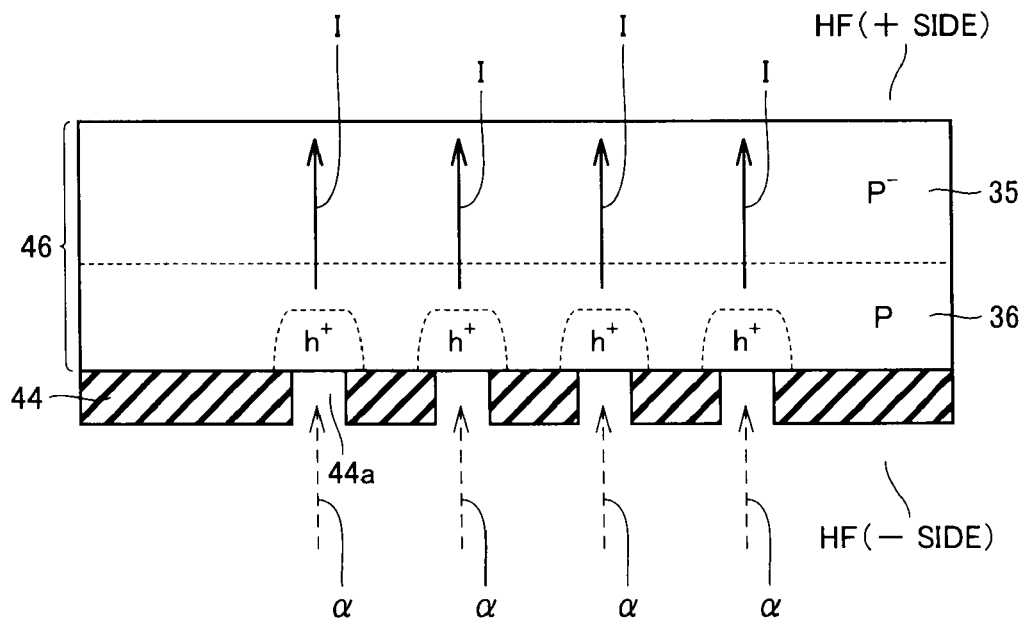
FIGS. 15A to 15C show a method of manufacturing the sixth buried oxide film shown in FIGS. 14A and 14B.
Figure 15B:
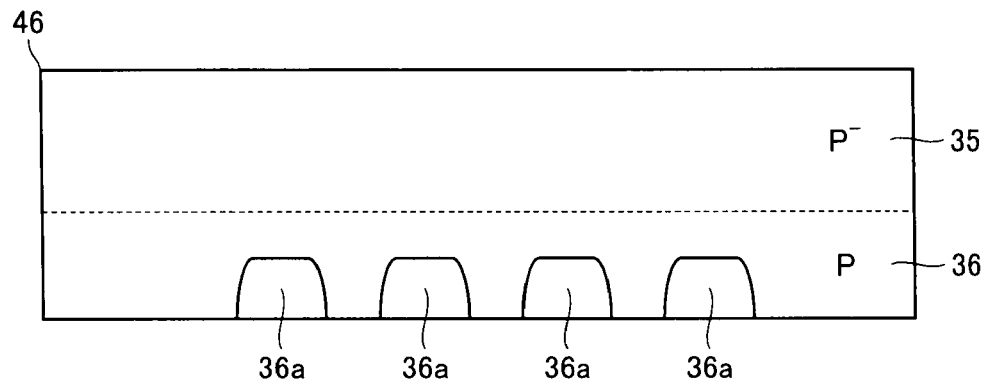
Figure 15C:
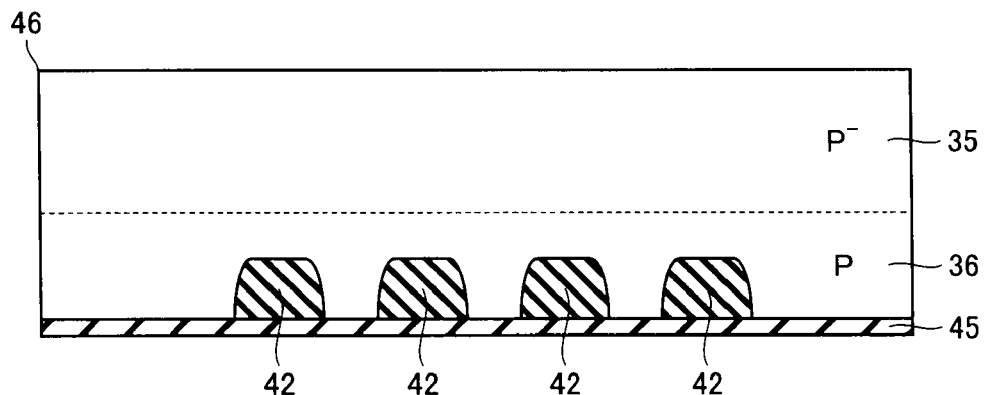

FIGS. 15A-15C show a method of manufacturing sixth buried oxide film 42 shown in FIGS. 14A and 14B. In this HVIC, two silicon substrates 1 and 46 are used. Dielectric layer 2 is formed in the surface of silicon substrate 1. The other silicon substrate 46 is formed of P⁻ type single crystal silicon layer 35, as shown in FIG. 15A. After forming P type well 36 of low impurity concentration on the bottom of silicon substrate 46, mask 44 formed of a light shielding film is formed in P type well 36. A plurality of pores 44a, shaped corresponding to the shape in plan view of the plurality of sixth buried oxide films 42, is formed in mask 44.

Next, the front side and the rear side of silicon substrate 46 are immersed independently in an HF solution. If a positive (+) potential is applied to the P⁻ type single crystal silicon layer 35 side and a negative (−) potential is applied to the N type well 36 side in this state, anodization current I will flow within silicon substrate 46. Subsequently, when excitation light α is radiated to P type well 36 through pores 44a from the mask 44 side, holes h⁺ are generated in a portion of P type well 36 which has received the light and the chemical reaction represented by above-mentioned formula (1) occurs in the portion.

By this chemical reaction, as shown in FIG. 15B, a porous silicon film 36a is generated in a portion corresponding to pores 44a of mask 44 of P type well 36. Note that the cross sectional shape of porous silicon film 36a is swelled in the width direction because the anodization reaction is isotropic. When the surface of P type well 36 is treated with thermal oxidation after mask 44 is removed, porous silicon film 36a is oxidized and changed to sixth buried oxide film 42 (porous oxide film), as shown in FIG. 15C, and oxide film 45 is formed in the entire surface of P type well 36. This oxide film 45 is affixed to first buried oxide film 10 formed in the surface of substrate 1. The film thickness of oxide film 45 can be set to be very thin because the thermal oxidation rate of porous silicon film 36a is tens to hundreds of times higher than the thermal oxidation rate of a single crystal silicon.

Fifth Embodiment

Figure 16A:
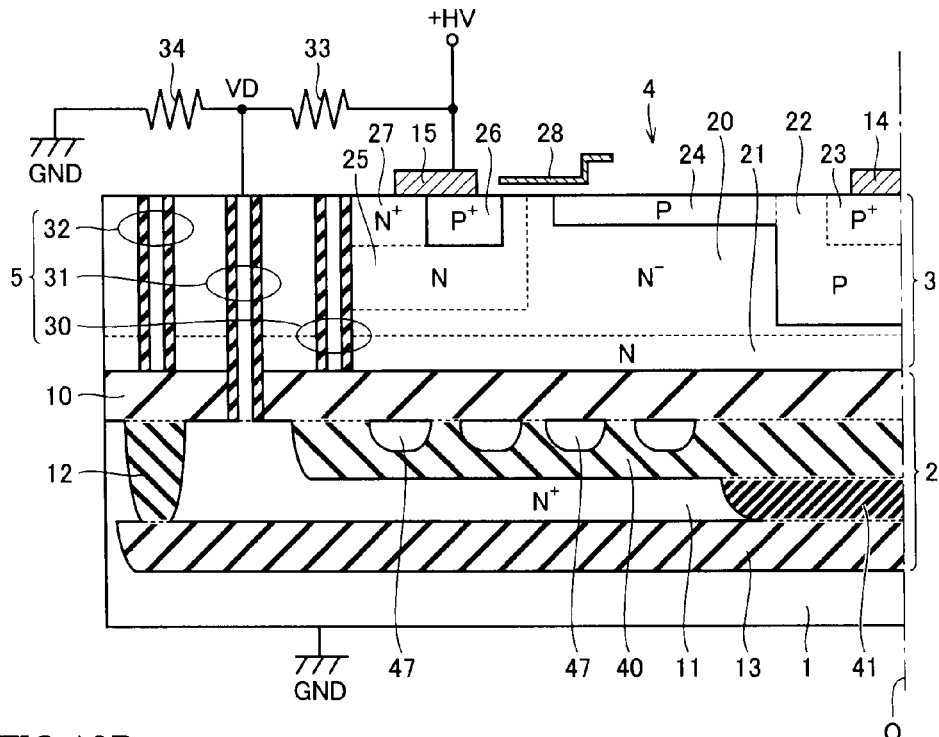
FIGS. 16A and 16B are cross sectional views showing the principal part of the HVIC according to a fifth embodiment of the present invention.

FIG. 16A is a cross sectional view showing a principal part of the HVIC according to the fifth embodiment of the present invention, and is compared with FIG. 8A. In FIG. 16A, this HVIC is different from the HVIC of the third embodiment in that one or a plurality of (4 in the figure) $N^+$ type silicon layers 47 are added. $N^+$ type silicon layer 47 is provided below first buried oxide film 10 in the region inner than first trench 30 in a condition of being formed in a shape of a ring, embedded in fourth buried oxide film 40.

Figure 16B:
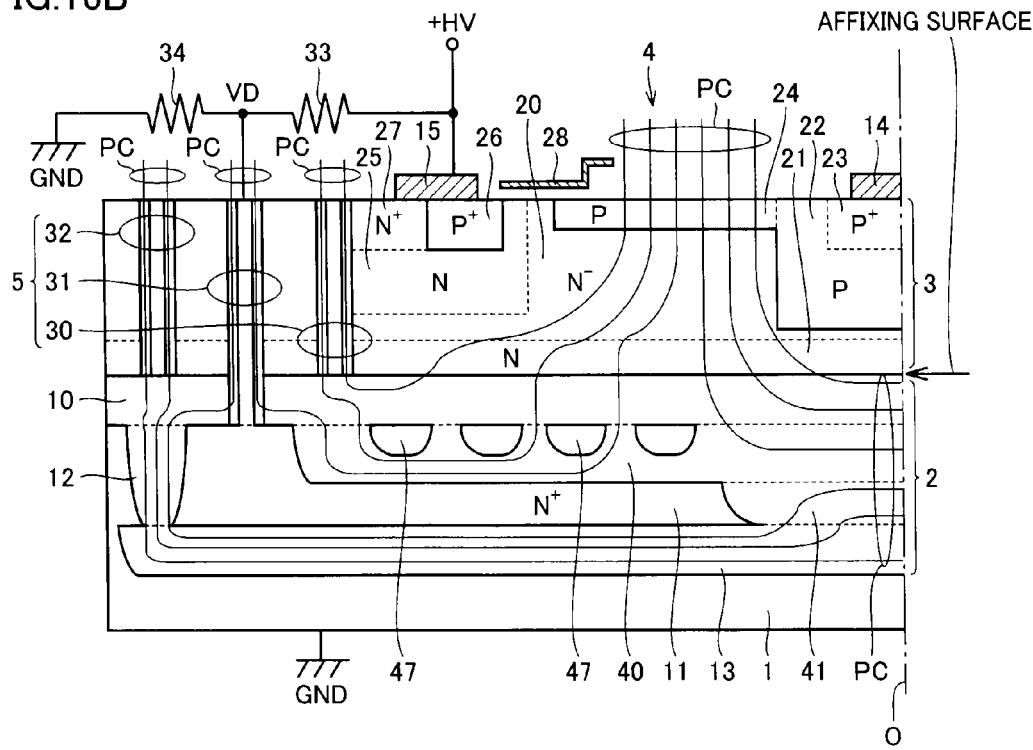
Figure 17:
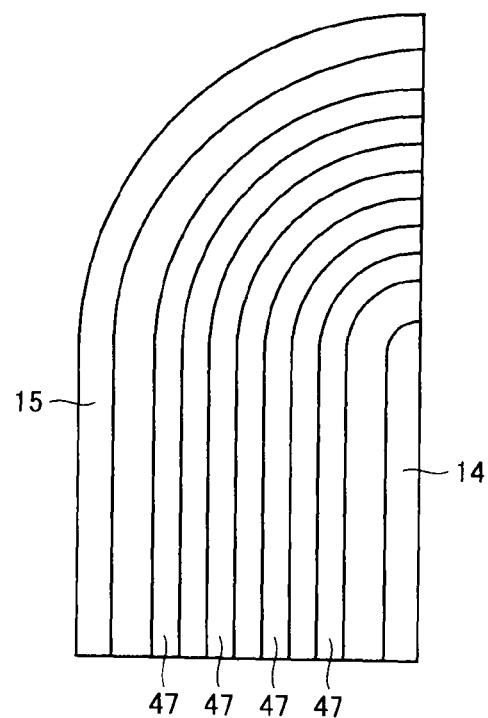
FIG. 17 shows the layout of the sixth buried oxide film shown in FIGS. 16A and 16B.

FIG. 16B shows an equipotential distribution when a positive high voltage (+HV) is applied to source electrode 15 of P channel MOS transistor 4 and a ground potential GND is applied to drain electrode 14. As shown in FIG. 16B, a plurality of equipotential distribution curves PC passing through inside first to third trenches 30-32 are branched into curves extending through first and fourth buried oxide films 10, 40 and curves extending through second and third buried oxide films 12, 13. Moreover, a plurality of equipotential distribution curves PC which were branched into curves extending through the upper side and curves extending through the lower side of shield layer 11 are unified below the drain region. Furthermore, the plurality of equipotential distribution curves PC is distributed evenly in a lateral direction in fourth buried oxide film 40, because the plurality of $N^+$ type silicon layers 47 is arranged with a predetermined pitch in fourth buried oxide film 40. Therefore, the equipotential distribution curves PC are lower in density than in the third embodiment by the amount corresponding to $N^+$ type silicon layer 47, and a high withstand voltage is achieved FIG. 17 shows a diagram of a layout of the plurality of $N^+$ type silicon layers 47. In FIG. 17, the plurality of $N^+$ type silicon layers 47 is laid out in a shape of the track with a plurality of courses. That is, drain electrode 14 is arranged in the center of the track, and source electrode 15 is arranged on the outermost course. The plurality of $N^+$ type silicon layers 47 is arranged on the plurality of courses, respectively. Each $N^+$ type silicon layer 47 is formed in a shape of an ellipse ring, and the circumference of an outer $N^+$ type silicon layer 47 is longer than the circumference of an inner $N^+$ type silicon layer 47.

Figure 18:
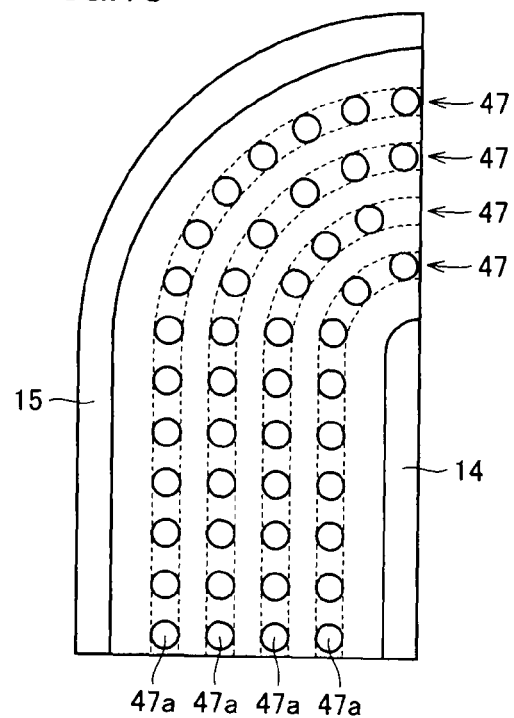
FIG. 18 is a cross sectional view showing a modification of the fifth embodiment.

FIG. 18 is a cross sectional view showing a modification of the fifth embodiment, and is compared with FIG. 17. In FIG. 18, this modification is different from the HVIC of the fifth embodiment in that each $N^+$ type silicon layer 47 is divided into a plurality of silicon layers 47a, which is arranged in a shape of a ring with a predetermined pitch. Each silicon layer 47a is formed in a shape of a dot. In this modification as well, the same effect as the fifth embodiment can be obtained.

Figure 19A:
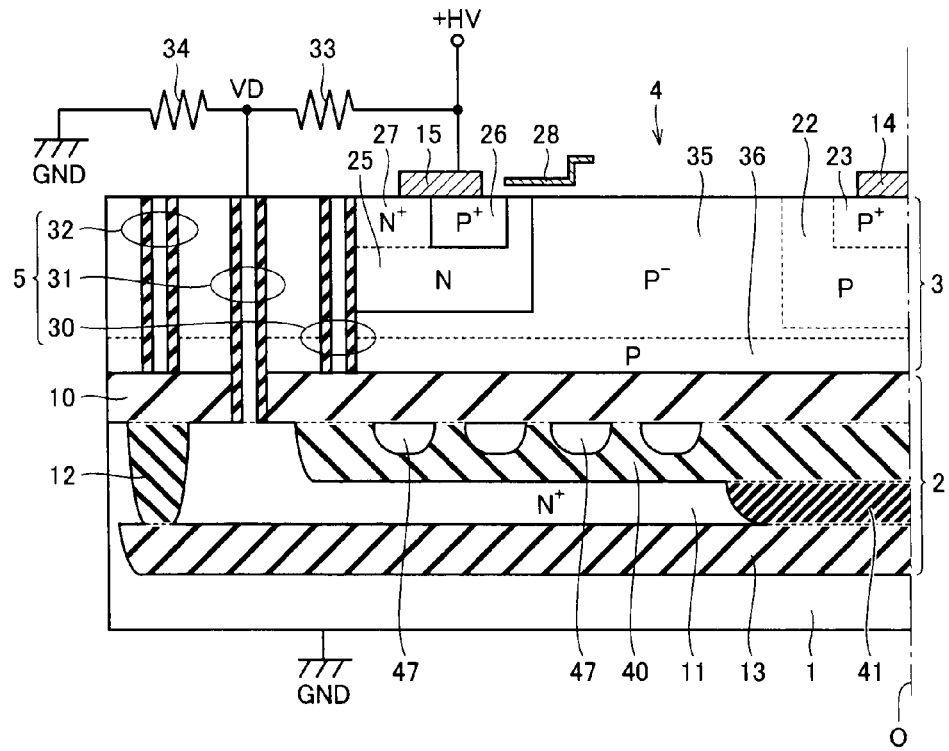
FIGS. 19A and 19B are cross sectional views showing another modification of the fifth embodiment.
Figure 19B:
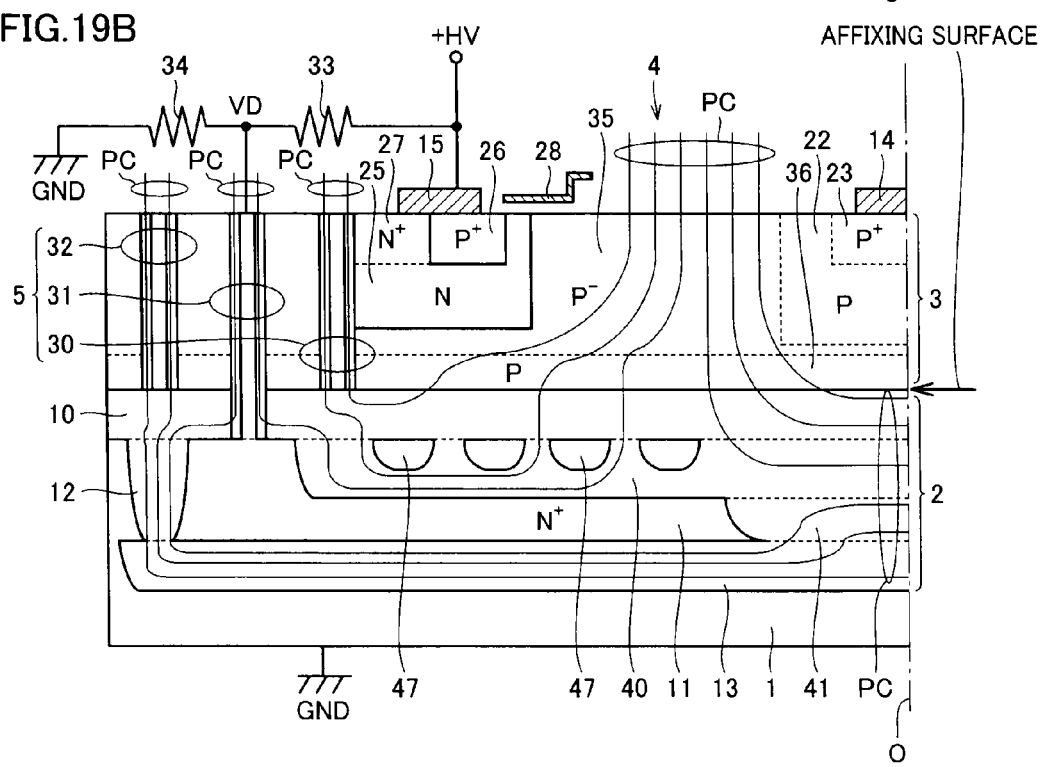

FIGS. 19A and 19B are cross sectional views showing another modification of the fifth embodiment, and are compared with FIGS. 16A and 16B. In FIGS. 19A and 19B, this modification is different from the HVIC of the fifth embodiment in that SOI active layer 3 is formed of P$^-$ type single crystal silicon layer 35, N type well 21 of low impurity concentration is replaced by P type well 36 of low impurity concentration, and that P type drain layer 24 is not provided. In this modification as well, the same effect as the fifth embodiment can be obtained.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a dielectric layer formed in a surface of a semiconductor substrate;
   a first semiconductor layer formed in a surface of said dielectric layer;
   a semiconductor element formed in a surface of said first semiconductor layer; and
   a ring-shaped trench isolation region formed surrounding said semiconductor element, said dielectric layer including
      a first buried oxide film formed in the surface of said semiconductor substrate,
      a shield layer formed below said first buried oxide film and opposite said semiconductor element and receiving a predetermined potential,
      a ring-shaped second buried oxide film formed below said first buried oxide film and surrounding said shield layer, and
      a third buried oxide film formed below said shield layer and said second buried oxide film.

2. The semiconductor device according to claim 1, wherein said trench isolation region includes:
   ring-shaped first to third trenches successively formed surrounding said semiconductor element;
   two oxide films respectively formed on both sidewalls of each of said first to third trenches; and
   a conductive layer formed between said two oxide films of each of said first to third trenches,
   said first and second trenches are provided above said shield layer and said third trench is provided above said second buried oxide film,
   each of said first and third trenches penetrates said first semiconductor layer and reaches said first buried oxide film, said second trench penetrates said first semiconductor layer and said first buried oxide film and reaches said shield layer, and
   said shield layer receives said predetermined potential through said conductive layer within said second trench.

3. The semiconductor device according to claim 2, wherein said dielectric layer further includes a fourth buried oxide film formed below said first buried oxide film in a region inner than said second trench in a condition of being embedded in said shield layer.

4. The semiconductor device according to claim 3, wherein said shield layer is formed in a shape of a ring, and
   said dielectric layer further includes a fifth buried oxide film formed between said third and fourth buried oxide films in a region inner than said shield layer.

5. The semiconductor device according to claim 4, wherein said dielectric layer further includes one or not less than two sixth buried oxide films formed on said first buried oxide film in a region inner than said first trench in a condition of projecting into said first semiconductor layer, and
   each sixth buried oxide film is formed in a shape of a ring surrounding a central line of said semiconductor device.

6. The semiconductor device according to claim 5, wherein each sixth buried oxide film is divided into a plurality of suboxide films arranged in a shape of a ring.

7. The semiconductor device according to claim 4, wherein said dielectric layer further includes one or not less than two second semiconductor layers formed below said buried oxide film in a region inner than said first trench in a condition of being embedded in said fourth buried oxide film, and each second semiconductor layer is formed in a shape of a ring surrounding a central line of said semiconductor device.

8. The semiconductor device according to claim 7, wherein each second semiconductor layer is divided into a plurality of subsemiconductor layers arranged in a shape of a ring.

9. The semiconductor device according to claim 1, wherein said shield layer is formed of a semiconductor.

10. The semiconductor device according to claim 1, wherein each buried oxide film other than said first buried oxide film is formed of a porous oxide film.

11. The semiconductor device according to claim 1, wherein said semiconductor element is a P channel MOS transistor, said P channel MOS transistor includes a drain electrode formed in a center section of the surface of said first semiconductor layer, a ring-shaped gate electrode formed surrounding said drain electrode on the surface of said first semiconductor layer, and a ring-shaped source electrode formed surrounding said gate electrode on the surface of said first semiconductor layer.

12. The semiconductor device according to claim 11, wherein said predetermined potential is a potential generated by dividing a voltage between a source potential and a ground potential of said P channel MOS transistor.

* * * * *